_ _ _ _ _ _ _ _ _ _

United States Patent
Kim et al.

(10) Patent No.: US 10,666,883 B2
(45) Date of Patent: May 26, 2020

(54) IMAGE SENSOR AND ELECTRONIC CIRCUIT INCLUDED THEREIN

(71) Applicant: Samsung Electronics Co., Ltd., Suwon-si, Gyeonggi-do (KR)

(72) Inventors: Moo Young Kim, Suwon-si (KR); KyoungMin Koh, Hwaseong-si (KR); Woong Joo, Seoul (KR); Mira Lee, Suncheon-si (KR); Kyung-Min Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 81 days.

(21) Appl. No.: 15/940,421

(22) Filed: Mar. 29, 2018

(65) Prior Publication Data

US 2019/0007632 A1    Jan. 3, 2019

(30) Foreign Application Priority Data

Jun. 28, 2017   (KR) ......................... 10-2017-0081847

(51) Int. Cl.
| | |
|---|---|
| *H04N 5/225* | (2006.01) |
| *H04N 5/359* | (2011.01) |
| *H04N 5/369* | (2011.01) |
| *H04N 5/378* | (2011.01) |
| *H04N 5/374* | (2011.01) |
| *H04N 5/357* | (2011.01) |
| *H01L 27/146* | (2006.01) |

(52) U.S. Cl.
CPC ........... *H04N 5/359* (2013.01); *H04N 5/3577* (2013.01); *H04N 5/3595* (2013.01); *H04N 5/3698* (2013.01); *H04N 5/374* (2013.01); *H04N 5/378* (2013.01); *H01L 27/14634* (2013.01)

(58) Field of Classification Search
CPC .......................................... H04N 5/3595–3598
See application file for complete search history.

(56) References Cited

U.S. PATENT DOCUMENTS

| | | |
|---|---|---|
| 6,801,254 B1 | 10/2004 | Nishio |
| 7,423,680 B2 | 9/2008 | Han |
| 7,646,412 B2 | 1/2010 | Hisamatsu et al. |
| 7,898,587 B2 | 3/2011 | Masuyama et al. |

(Continued)

FOREIGN PATENT DOCUMENTS

| | | |
|---|---|---|
| JP | 5881324 | 3/2016 |
| JP | 2017022444 | 1/2017 |
| KR | 10-0809680 | 3/2008 |

*Primary Examiner* — Twyler L Haskins
*Assistant Examiner* — Dwight Alex C Tejano
(74) *Attorney, Agent, or Firm* — Myers Bigel, P.A.

(57) ABSTRACT

An electronic circuit includes a unit pixel, a first clamp circuit, and a second clamp circuit. The unit pixel outputs a voltage having an output voltage level at a first output voltage level in a first time interval and at a second output voltage level in a second time interval different from the first time interval. The first clamp circuit is configured to clamp the output voltage level from the unit pixel to a first voltage level responsive to the first output voltage level being not greater than the first voltage level in the first time interval. The second clamp circuit is configured to clamp the output voltage level from the unit pixel to a second voltage level responsive to the second output voltage level being not greater than the second voltage level in the second time interval.

20 Claims, 15 Drawing Sheets

(56) References Cited

U.S. PATENT DOCUMENTS

| | | |
|---|---|---|
| 8,456,558 B2 | 6/2013 | Nishihara |
| 8,766,843 B2 | 7/2014 | Ueno |
| 9,142,689 B2 | 9/2015 | Kondo |
| 9,443,896 B2 | 9/2016 | Hirase |
| 2004/0155973 A1* | 8/2004 | Bea ................ H04N 5/3575 348/308 |
| 2007/0165117 A1* | 7/2007 | Toya ............... H04N 5/3598 348/241 |
| 2007/0258000 A1* | 11/2007 | Kondo ............. H04N 5/217 348/308 |
| 2008/0143863 A1* | 6/2008 | Masuyama ....... H04N 3/155 348/308 |
| 2009/0079849 A1* | 3/2009 | Kondo ............. H04N 5/353 348/231.99 |
| 2015/0236063 A1 | 8/2015 | Takada |
| 2015/0285625 A1 | 10/2015 | Deane |
| 2016/0044265 A1* | 2/2016 | Kato ............... H04N 5/361 348/308 |
| 2017/0244918 A1* | 8/2017 | Sakuragi ......... H04N 5/363 |

\* cited by examiner

IMAGE SENSOR AND ELECTRONIC CIRCUIT INCLUDED THEREIN

CROSS-REFERENCE TO RELATED APPLICATIONS

A claim for priority under 35 U.S.C. § 119 is made to Korean Patent Application No. 10-2017-0081847 filed on Jun. 28, 2017, in the Korean Intellectual Property Office, the entire contents of which are hereby incorporated by reference.

BACKGROUND

Embodiments of the inventive concept disclosed herein relate to an electronic circuit, and, more particularly, to an image sensor.

An image sensor may include an electronic circuit for sensing light. Image sensors are used in electronic devices, such as cameras, scanners, and/or smartphones. An image sensor may include a charge coupled device (CCD) image sensor and a complementary metal-oxide semiconductor (CMOS) image sensor (CIS). There is an increasing demand for CMOS image sensors for use in smartphone cameras.

A CMOS image sensor may include unit pixels implemented with CMOS transistors. A CMOS image sensor may use photo diodes included in the unit pixels to sense light. A photo diode absorbs light energy, generating electron-hole pairs (EHPs). Transistors included in a pixel convert charges generated by the photo diode to a voltage signal. The CMOS image sensor obtains information about light energy sensed by unit pixels by using voltage signals generated in the unit pixels.

Because the unit pixels of a CMOS image sensor are manufactured using fine processes, noise due to coupling may occur. A smear, such as horizontal noise (SHBN), is noise occurring in the CMOS image sensor. SHBN means noise corresponding to a fixed horizontal pattern due to coupling between adjacent pixels. For example, in the case where an image sensor senses a bright light source in a low-illuminance environment, an image including a fixed, band shape pattern may be output.

SUMMARY

Embodiments of the inventive concept provide an image sensor for reducing a coupling noise and an electronic circuit for configuring the image sensor.

According to some embodiments of the inventive concept, an electronic circuit may include a unit pixel, a first clamp circuit, and a second clamp circuit. The unit pixel may output a voltage having an output voltage level at a first output voltage level in a first time interval and at a second output voltage level in a second time interval different from the first time interval. The first clamp circuit may clamp the output voltage level from the unit pixel to a first voltage level responsive to the first output voltage level being not greater than the first voltage level in the first time interval. The second clamp circuit may clamp the output voltage level from the unit pixel to a second voltage level responsive to the second output voltage level being not greater than the second voltage level in the second time interval.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the specification set forth below.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, example embodiments of the present inventive concept will be described with reference to the accompanying drawings.

The term "clamping" is used in this specification. The term "clamping" may mean to adjust, maintain, and/or control a level of an output voltage output from an electronic circuit and the like so as to have a level similar to a reference level. The term "clamp circuit" is used in this specification. The term "clamp circuit" may mean an electronic circuit configured to perform clamping. The term "code value" is used in this specification. The term "code value" is a digital value corresponding to specific analog information and may include a value obtained by quantizing an analog signal.

Some embodiments of the inventive concept may stem from a realization that transistor circuits associated with unit pixels may share a common bias voltage line and output voltage lines for the respective pixels may be in close proximity to the common bias voltage line. As a result, a transition in the output voltage for one pixel may affect the voltage of the carried on the bias voltage line, which in turn can affect the output voltage on the output line corresponding to another pixel. This undesired coupling may be manifest as noise on a display. Some embodiments of the present inventive concept may provide one or more clamping circuits that clamp the output voltage of a unit pixel to a defined level when the output voltage level would otherwise fall below the defined level due to the aforementioned coupling effects.

Figure 1:
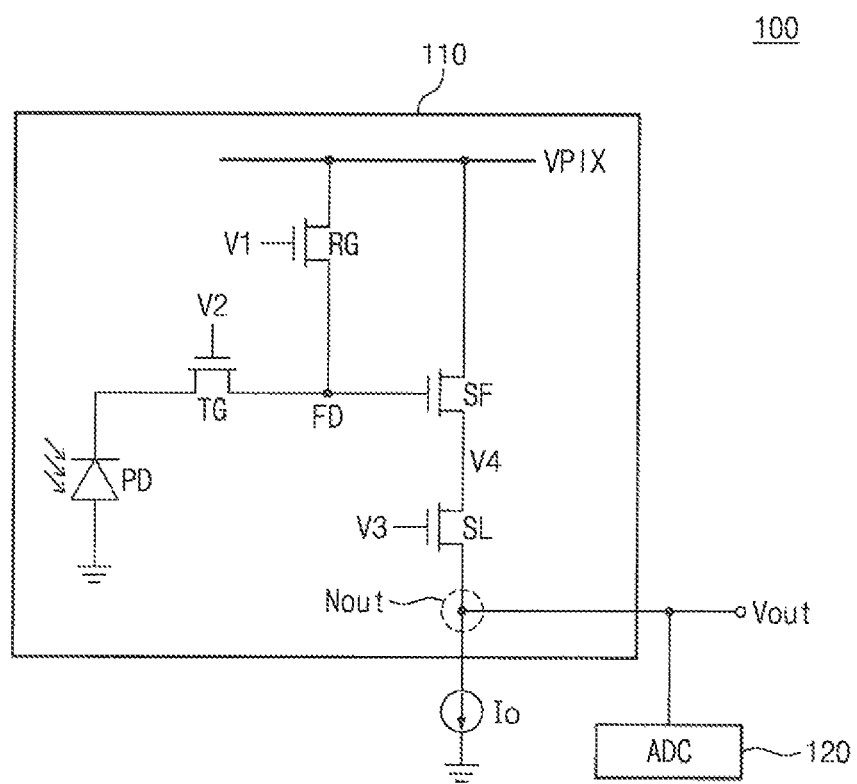
FIG. 1 is a circuit diagram illustrating an image sensor according to an embodiment of the inventive concept.

FIG. 1 is a circuit diagram illustrating an image sensor according to an embodiment of the inventive concept.

Referring to FIG. 1, an image sensor 100 may include a unit pixel 110, a current source Io, and one or more analog to digital converters (ADCs). Below, the image sensor 100 including the ADC 120 will be described with reference to FIG. 1. The unit pixel 110 may include a photo diode PD and one or more CMOS transistors. Below, the unit pixel 110 including four CMOS transistors will be described with reference to FIG. 1. However, the inventive concept is not limited thereto and may generally include unit pixel embodiments including one or more CMOS transistors. In an example of FIG. 1, the unit pixel 110 may include a transfer transistor TG, a reset transistor RG, a buffer transistor SF, and a selection transistor SL.

The reset transistor RG may receive a reset voltage V1 through a gate terminal thereof. The reset transistor RG may be turned on or turned off responsive to the reset voltage V1. The transfer transistor TG may receive a transfer voltage V2 through a gate terminal thereof. The transfer transistor TG may be turned on or turned off responsive to the transfer voltage V2. The selection transistor SL may receive a selection voltage V3 through a gate terminal thereof. The selection transistor SL may be turned on or turned off responsive to the selection voltage V3.

For example, the reset voltage V1, the transfer voltage V2, and the selection voltage V3 may be received from a voltage generator. Levels of the reset voltage V1, the transfer voltage V2, and the selection voltage V3 may be controlled by the voltage generator. The voltage generator may be disposed inside or outside the image sensor 100 in accordance with various embodiments of the inventive concept.

One end of the photo diode PD may be connected to a driving voltage. For example, the driving voltage may be a ground voltage or other reference voltage. Below, an example in which the driving voltage is a ground voltage will be described with reference to FIG. 1, but embodiments of the inventive concept are not limited thereto. An opposite end of the photo diode PD may be connected to one end of the transfer transistor TG. The transfer transistor TG may connect the photo diode PD and a floating diffusion node FD.

The reset transistor RG may receive a first bias voltage VPIX through one terminal thereof. For example, the first bias voltage VPIX may be received from the voltage generator to the reset transistor RG through a line for the first bias voltage VPIX. A level of the first bias voltage VPIX may be controlled by the voltage generator or the like. An opposite terminal of the reset transistor RG may be connected to the floating diffusion node FD.

A gate terminal of the buffer transistor SF may be connected to the floating diffusion node FD. The buffer transistor SF may receive the first bias voltage VPIX from a voltage generator through one terminal thereof. An opposite terminal of the buffer transistor SF may be connected to the selection transistor SL. The selection transistor SL may connect the buffer transistor SF and an output terminal Nout. The current source Io may connect the output terminal Nout and a ground terminal. The current source Io may limit a current flowing through the buffer transistor SF and the selection transistor SL. For example, a level of a current output from the unit pixel 110 may be the same as a level of a current output from the current source Io.

In the example of FIG. 1, the reset transistor RG and the buffer transistor SF receiving the first bias voltage VPIX are described according to some embodiments of the inventive concept. In other embodiments of the inventive concept, the reset and buffer transistors RG and SF of the inventive concept may receive different bias voltages, respectively.

The photo diode PD may output charges in response to light. The amount of charges output by the photo diode PD may increase as the intensity of light becomes greater. Charges output by the photo diode PD may be transferred to the floating diffusion node FD by the transfer transistor TG. A voltage level of the floating diffusion node FD may decrease due to charges transferred from the photo diode PD. The buffer transistor SF may output a voltage V4 corresponding to a voltage of the floating diffusion node FD. The selection transistor SL may output an output voltage Vout corresponding to the voltage V4 to the output terminal Nout in response to the selection voltage V3. Accordingly, the unit pixel 110 may output the output voltage Vout corresponding to the intensity of input light.

The reset transistor RG may adjust a voltage of the floating diffusion node FD to a constant voltage in response to the reset voltage V1. The buffer transistor SF may output the voltage V4 corresponding to the constant voltage. The selection transistor SL may output an output voltage Vout corresponding to the voltage V4 to the output terminal Nout in response to the selection voltage V3. Accordingly, the output voltage Vout may be adjusted to a reference voltage by the reset transistor RG.

The output voltage Vout may be output to the ADC 120. A ramp voltage generator (not illustrated) may output a ramp voltage. The ADC 120 may receive the ramp voltage from the ramp voltage generator. A clock signal generator (not illustrated) may output a clock signal. The ramp voltage generator may receive the clock signal from the clock signal generator. The received clock signal may include pulses. The ramp voltage generator may output the ramp voltage in response to the pulses included in the clock signal. The ramp voltage generator and the clock signal generator may be disposed inside or outside the image sensor 100.

The ADC 120 may count the pulses included in the clock signal in response to the received ramp voltage and the output voltage Vout in response thereto. The ADC 120 may output a code value of the unit pixel 110 based on the ramp voltage and the output voltage Vout. That is, the ADC 120 may output a code value corresponding to the output voltage Vout.

Figure 2:
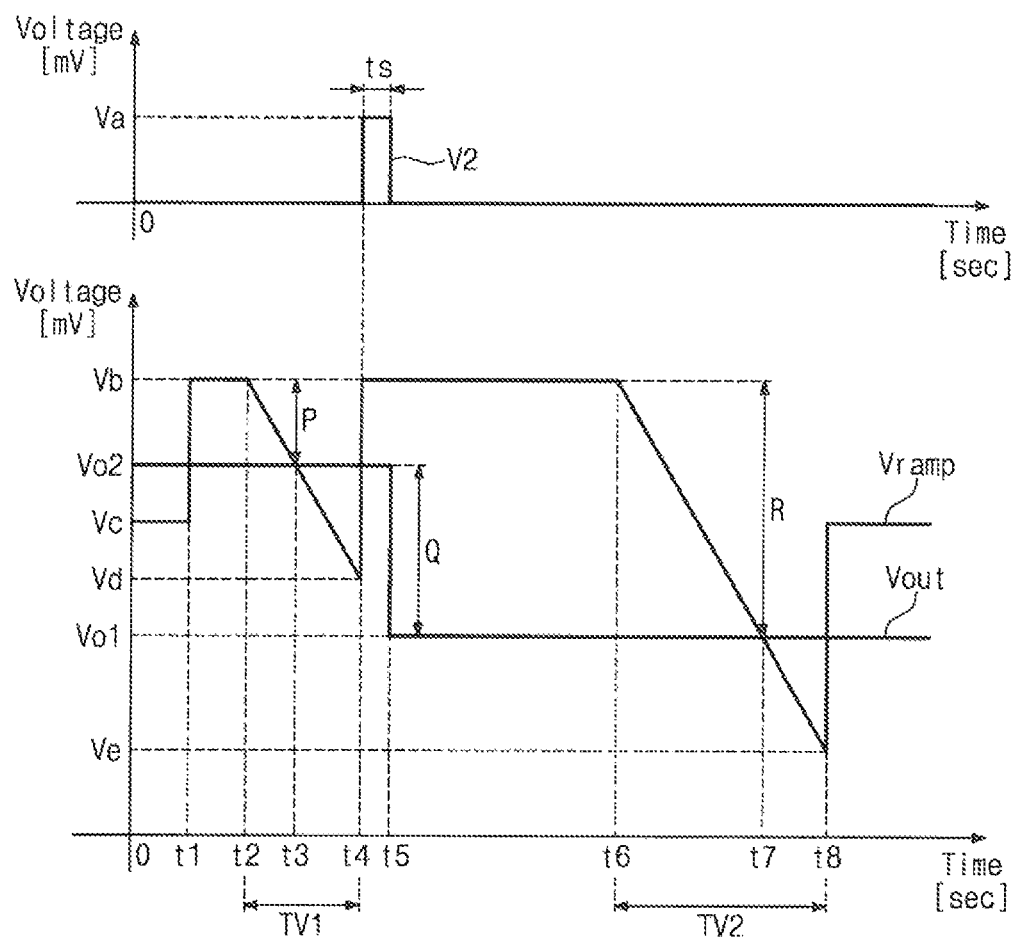
FIG. 2 is a timing diagram illustrating an example of voltages output and input by the image sensor of FIG. 1 and a ramp voltage.

FIG. 2 is a timing diagram illustrating an example of voltages output and input by an image sensor of FIG. 1 and a ramp voltage according to an embodiment of the inventive concept. As described with reference to FIG. 1, a ramp voltage generator may output a ramp voltage Vramp of FIG. 2. A level of the ramp voltage Vramp may be controlled by the ramp voltage generator.

As described with reference to FIG. 1, the gate terminal of the transfer transistor TG illustrated in FIG. 1 may receive the transfer voltage V2 of FIG. 2. Also, the unit pixel 110 of FIG. 1 may output the output voltage Vout of FIG. 2.

A first interval TV1 and a second interval TV2 may be associated with a slope value that a graph of the ramp voltage Vramp represents. Each of the first interval TV1 and the second interval TV2 may include an interval in which the ramp voltage Vramp varies at a substantially constant ratio over time. For example, the first interval TV1 and the second interval TV2 may include an interval in which the ramp voltage Vramp decreases at a substantially constant ratio over time. The first interval TV1 and the second interval TV2 may be different from each other. The first interval TV1 may arrive before the second interval TV2. In the example of FIG. 2, the first interval TV1 may include an interval between a time point t2 and a time point t4. The second interval TV2 may include an interval between a time point t6 and a time point t8.

Before a time point t1, the reset transistor RG may be turned on during a specific time interval in response to the reset voltage V1 received through the gate terminal thereof. Before the time point t1, a level of the output voltage Vout may be adjusted to Vc by the reset transistor RG.

A level of the transfer voltage V2 may be "0" between a time point "0" and the time point t1. Between the time point "0" and the time point t1, a level of the ramp voltage Vramp may be Vc, and a level of the output voltage Vout may be Vo2. Between the time point "0" and the time point t1, the transfer transistor TG may be turned off in response to the transfer voltage V2.

At the time point t1, a level of the ramp voltage Vramp may increase from Vc to Vb by the ramp voltage generator. Between the time point t1 and a time point t2, a level of the transfer voltage V2 is "0", a level of the ramp voltage Vramp may be Vb, and a level of the output voltage Vout may be Vo2.

In the first interval TV1, a code value may be output based on the ramp voltage Vramp and the output voltage Vout. In the first interval TV1, a level of the ramp voltage Vramp may decrease at a substantially constant ratio over time by the ramp voltage generator. In the first interval TV1, a level of the ramp voltage Vramp may decrease from Vb to Vd. As described with reference to FIG. 1, the ADC 120 may count pulses included in the clock signal in the first interval TV1. One counted pulse may correspond to one least significant bit (LSB). In the example of FIG. 2, pulses counted between the time point t2 and a time point t3 may correspond to "P".

At the time point t4, a level of the ramp voltage Vramp may increase from Vd to Vb by the ramp voltage generator. At the time point t4, a level of the transfer voltage V2 may increase from "0" to Va by the voltage generator. By the voltage generator, the transfer voltage V2 may be Va during "ts" second from the time point t4. Accordingly, the transfer transistor TG may be turned on during "ts" second in response to the transfer voltage V2 received through the gate terminal thereof. As described with reference to FIG. 1, the transfer transistor TG may transfer charges generated by the photo diode PD to the floating diffusion node FD. Accordingly, the transfer transistor TG may transfer charges generated by the photo diode PD to the floating diffusion node FD during a time "ts" from the time point t4.

As described with reference to FIG. 1, the unit pixel 110 may output the output voltage Vout corresponding to a voltage level of the floating diffusion node FD. The voltage level of the floating diffusion node FD may decrease by charges transferred by the transfer transistor TG. As the voltage level of the floating diffusion node FD decreases, a level of the output voltage Vout may decrease from Vo2 to Vo1 at a time point t5.

In the second interval TV2, a code value may be output based on the ramp voltage Vramp and the output voltage Vout. In the second interval TV2, a level of the ramp voltage Vramp may decrease at a constant ratio over time by the ramp voltage generator. In the second interval TV2, a level of the ramp voltage Vramp may decrease from Vb to Ve. As described with reference to FIG. 1, the ADC 120 may count pulses included in the clock signal in the second interval TV2. One counted pulse may correspond to one least significant bit (LSB). In the example of FIG. 2, pulses counted between the time point t6 and a time point t7 may correspond to "R".

The ADC 120 may calculate a difference value between "P" and "R". In the example of FIG. 2, the difference value calculated by the ADC 120 may be "Q". The difference value calculated by the ADC 120 may correspond to a code value of the unit pixel 110. The code value may correspond to the intensity of light sensed by the photo diode PD. The calculated code value may become greater as the intensity of light sensed by the photo diode PD becomes greater.

As described above with reference to FIG. 2, "Q" may become greater as the number of pulses counted by the ADC 120 increases in the second interval TV2. An interval between the time point t6 and the time point t7 may increase as "Q" becomes greater. The number of pulses counted in the second interval TV2 may increase as the interval between the time point t6 and the time point t7 increases.

The second interval TV2 may become longer as a slope value of a graph representing the ramp voltage Vramp in the second interval TV2 becomes smaller. The number of pulses counted in the second interval TV2 may increase as the second interval TV2 becomes longer. A slope value of a graph representing the ramp voltage Vramp in the first interval TV1 and the second interval TV2 may correspond to an analog gain.

Figure 3:
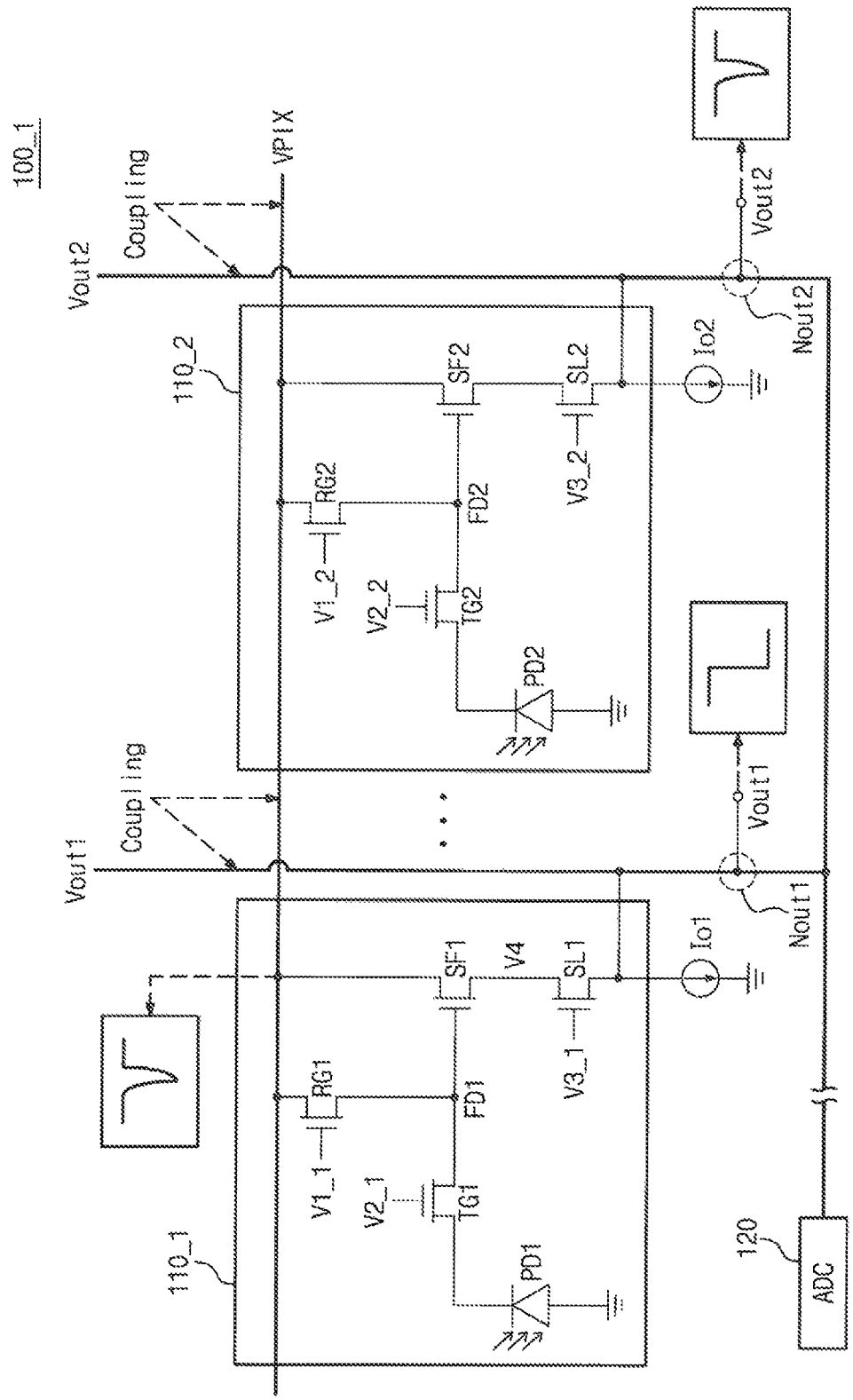
FIG. 3 is a circuit diagram illustrating an image sensor according to an embodiment of the inventive concept.

FIG. 3 is a circuit diagram illustrating an image sensor according to an embodiment of the inventive concept.

Referring to FIG. 3, an image sensor 100_1 may include one or more unit pixels. In an example of FIG. 3, the image sensor 100_1 may include a first pixel 110_1 and a second pixel 110_2. A configuration of the first pixel 110_1 and the second pixel 110_2 is similar to the configuration of the unit pixel 110 of FIG. 1, and a description thereof is thus omitted.

The photo diode PD may generate charges in response to light. Charges generated by the photo diode PD may be transferred to a floating diffusion node FD1 by a transfer transistor TG1. A voltage level of the floating diffusion node FD1 may decrease due to the charges transferred through the transfer transistor TG1. A buffer transistor SF1 may output the voltage V4 corresponding to a voltage of the floating diffusion node FD1. A selection transistor SL1 may output an output voltage Vout1 in response to a selection voltage V3_1. In the example of FIG. 3, a level of the output voltage Vout1 of the first pixel 110_1 may decrease at a specific time point. As in the description given with reference to FIG. 2, the ADC 120 may calculate a code value based on the decreased output voltage Vout1.

Referring to FIG. 3, a line for the first bias voltage VPIX and a line for the output voltage Vout1 may be placed adjacent to each other. The proximity of the line for the first bias voltage VPIX with the line for the output voltage Vout1 may cause the coupling. Accordingly, the first bias voltage VPIX may decrease as the output voltage Vout1 decreases.

Referring to FIG. 3, the line for the first bias voltage VPIX and a line for an output voltage Vout2 may be placed adjacent to each other. The proximity of the line for the first bias voltage VPIX with the line for the output voltage Vout2 may cause the coupling. Accordingly, a level of the output voltage Vout2 may decrease as a level of the first bias voltage VPIX decreases.

That is, a level of the output voltage Vout2 may decrease based on operation of the first pixel 110_1, not solely on operation of the second pixel 110_2. As in the description given with reference to FIG. 2, the ADC 120 may calculate a code value based on the decreased output voltage Vout2.

In the example of FIG. 3, the code value may be calculated based on the output voltage Vout2 varying regardless of an operation of the second pixel 110_2. The ADC 120 may calculate an abnormal code value based on the output voltage Vout2 varying due to coupling noise. In the following description, the abnormal code value may mean a code value that is calculated based on the output voltage Vout having a noise component. For example, the noise component may include a voltage component having a level based on the coupling. Alternatively, the noise component may include a voltage component that is output based on charges overflowed to the floating diffusion node FD through the transfer transistor TG (refer to FIG. 6). A display may output an image including the smear like horizontal noise (SHBN) based on the abnormal code value.

The coupling may occur between output voltage lines adjacent or proximal to the line for the first bias voltage VPIX. Accordingly, levels of output voltages output from unit pixels connected to the line for the first bias voltage VPIX may vary depending on fluctuations of the output voltage Vout1. Code values may be calculated based on output voltages varying based on the coupling. Accordingly, unit pixels connected to the line for the first bias voltage VPIX may generate output voltages affected by coupling noise. Accordingly, the display may output an image including the SHBN based on output voltages output from unit pixels connected to the line for the first bias voltage VPIX (refer to FIG. 15).

Due to the coupling, a level of the output voltage Vout2 may vary greatly as a level of the output voltage Vout1 varies greatly. Accordingly, more coupling noise may occur in the second pixel 110_2 as a level of the output voltage Vout1 may vary greatly. Because the second pixel 110_2 may be impacted by more coupling noise, the display may output an image including more SHBN (refer to FIG. 15).

Figure 4:
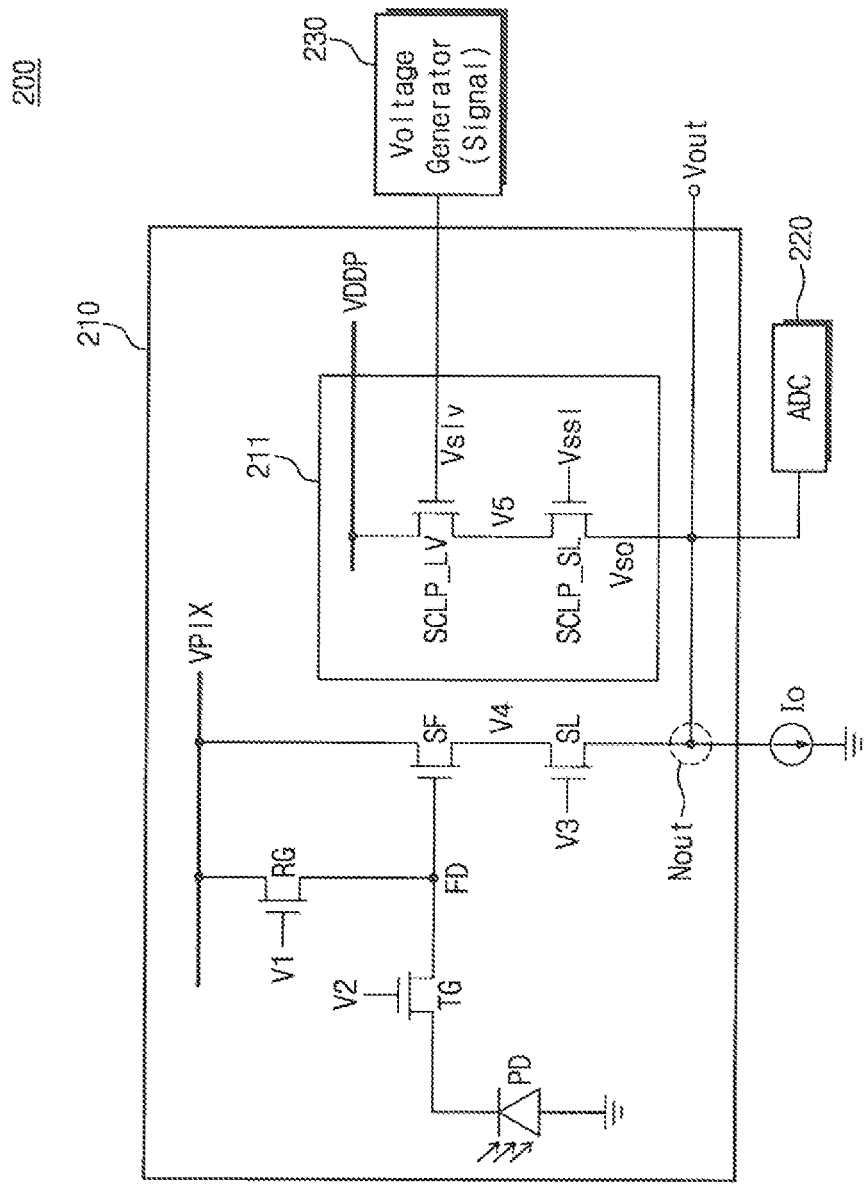
FIG. 4 is a circuit diagram illustrating an image sensor according to an embodiment of the inventive concept.

FIG. 4 is a circuit diagram illustrating an image sensor according to an embodiment of the inventive concept. An image sensor 200 of FIG. 4 may include a unit pixel 210, an ADC 220, and a voltage generator 230. The operation and configuration of the ADC 220 of FIG. 4 are similar to the operation and the configuration of the ADC 120 of FIGS. 1 and 2, and a description thereof is thus omitted. The unit pixel 210 of FIG. 4 may further include a first clamp circuit 211 as compared with the unit pixel 110 of FIG. 1.

Referring to FIG. 4, the first clamp circuit 211 may include a signal clamping level transistor SCLP_LV and a signal clamping selection transistor SCLP_SL.

The signal clamping level transistor SCLP_LV may receive a signal clamping level voltage Vslv from the voltage generator 230 through a gate terminal thereof. A level of the signal clamping level voltage Vslv may be set in advance in accordance with some embodiments of the inventive concept. The signal clamping level transistor SCLP_LV may receive a second bias voltage VDDP through one terminal thereof. The signal clamping level transistor SCLP_LV may receive the second bias voltage VDDP from a voltage generator or the like. A level of the second bias voltage VDDP may be controlled by the voltage generator or the like. An opposite terminal of the signal clamping level transistor SCLP_LV may be connected to one terminal of the signal clamping selection transistor SCLP_SL.

The signal clamping selection transistor SCLP_SL may receive a signal clamping selection voltage Vssl through a gate terminal thereof. For example, the signal clamping selection transistor SCLP_SL may receive the signal clamping selection voltage Vssl from the voltage generator or the like. A level of the signal clamping selection voltage Vssl may be controlled by the voltage generator or the like. The signal clamping selection transistor SCLP_SL may be turned on or turned off in response to the signal clamping selection voltage Vssl and the output voltage Vout. An opposite terminal of the signal clamping selection transistor SCLP_SL may be connected to the output terminal Nout.

For example, the signal clamping selection transistor SCLP_SL may have a first threshold voltage. A level of the first threshold voltage may be determined based on a characteristic of the signal clamping selection transistor SCLP_SL. The signal clamping selection transistor SCLP_SL may operate based on a difference value between a level of the signal clamping selection voltage Vssl and a level of the output voltage Vout. For example, in the case where the difference value between the level of the signal clamping selection voltage Vssl and the level of the output voltage Vout is not smaller than a level of a first threshold voltage, the signal clamping selection transistor SCLP_SL may be turned on. In the case where the difference value between the level of the signal clamping selection voltage Vssl and the level of the output voltage Vout is smaller than the level of the first threshold voltage, the signal clamping selection transistor SCLP_SL may be turned off.

A value obtained by subtracting a level of the first threshold voltage from a level of the output voltage Vout may be defined as a first voltage level. Accordingly, the signal clamping selection transistor SCLP_SL may operate based on whether a level of the output voltage Vout is not greater than the first voltage level. For example, in the case where a level of the output voltage Vout is not greater than the first voltage level, the signal clamping selection transistor SCLP_SL may be turned on. In the case where a level of the output voltage Vout is greater than the first voltage level, the signal clamping selection transistor SCLP_SL may be turned off.

The signal clamping level transistor SCLP_LV may output a voltage V5 corresponding to the signal clamping level voltage Vslv. The signal clamping level voltage Vslv may be associated with the first voltage level. Accordingly, the signal clamping level transistor SCLP_LV may output the voltage V5 associated with the first voltage level. In the case where the signal clamping selection transistor SCLP_SL is turned on in response to the signal clamping selection voltage Vssl and the output voltage Vout, the signal clamping selection transistor SCLP_SL may output a signal clamping output voltage Vso corresponding to the voltage V5. That is, the first clamp circuit 211 may output the signal clamping output voltage Vso corresponding to the signal clamping level voltage Vslv to the output terminal Nout. Accordingly, the signal clamping output voltage Vso may be associated with the first voltage level.

As described above, the first clamp circuit 211 may output the signal clamping output voltage Vso depending on whether a level of the output voltage Vout is not greater than the first voltage level. The output voltage Vout may be clamped to a specific level corresponding to a level of the signal clamping level voltage Vslv by the signal clamping output voltage Vso. For example, the specific level may be the first voltage level.

The configuration and the operation of the unit pixel 210 except for the first clamp circuit 211 are similar to the configuration and the operation of the unit pixel 110 of FIG. 1, and a description thereof is thus omitted.

Figure 5:
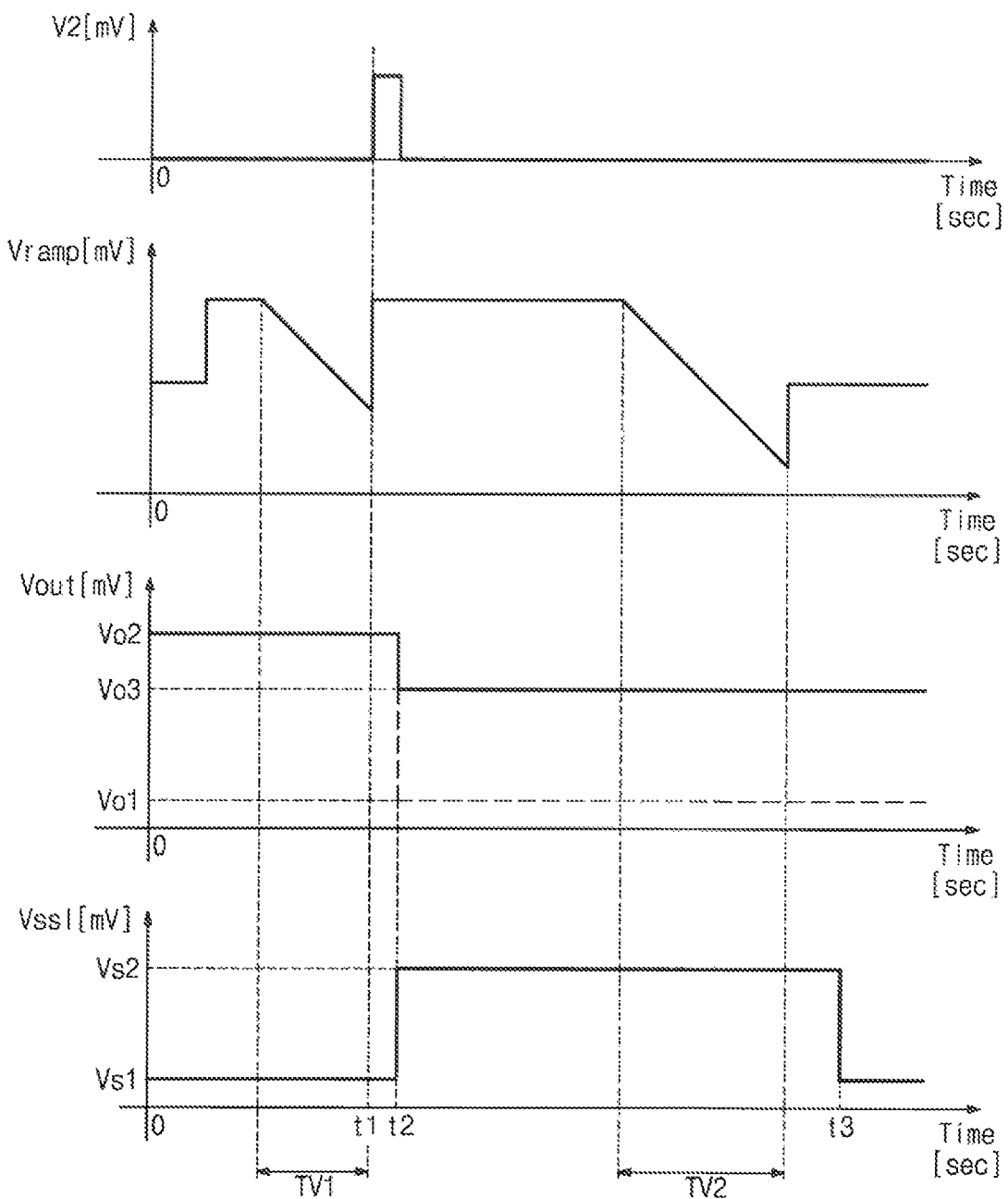
FIG. 5 is a timing diagram illustrating an example of voltages output and input by the image sensor of FIG. 4 and a ramp voltage.

FIG. 5 is a timing diagram illustrating an example of voltages output and input by an image sensor of FIG. 4 and a ramp voltage according to an embodiment of the inventive concept.

The transfer transistor TG of FIG. 4 may receive the transfer voltage V2 of FIG. 5 through a gate terminal thereof. The unit pixel 210 of FIG. 4 may output the output voltage Vout of FIG. 5. The signal clamping selection transistor SCLP_SL of FIG. 4 may receive the signal clamping selection voltage Vssl of FIG. 5 through a gate terminal thereof. In an example of FIG. 5, a change in the level of transfer voltage V2 and a level of the ramp voltage Vramp is similar to that described with reference to FIG. 2, and a description thereof is thus omitted. The first interval TV1 and the second interval TV2 are determined as in a description given with reference to FIG. 2, and a description thereof is thus omitted.

Between a time point "0" and a time point t2, a level of the signal clamping selection voltage Vssl may be Vs1. At the time point t2, a level of the signal clamping selection voltage Vssl may increase to Vs2 by a voltage generator or the like. At the time point t2, the signal clamping selection transistor SCLP_SL of FIG. 4 may be turned on in response to the signal clamping selection voltage Vssl. As described with reference to FIG. 4, a level of the output voltage Vout may be clamped to a specific level Vo3 corresponding to the signal clamping level voltage Vslv by the first clamp circuit 211. The specific level Vo3 may be the first voltage level of FIG. 4.

A graph represented by a dotted line may be a graph indicating a level of the output voltage Vout of FIG. 2. The unit pixel 110 of FIG. 1 may output the non-clamped output voltage Vout of FIG. 2. A level of the non-clamped output voltage Vout may be Vo1. In the example of FIG. 5, Vo3 may be greater than Vo1. Accordingly, in the case where a level of the output voltage Vout is clamped by the first clamp circuit 211, a level change of the output voltage Vout at the time point t2 may be smaller. As described with reference to FIG. 3, in the case where a level change of the output voltage Vout is smaller, a coupling noise occurring in pixels disposed adjacent to the unit pixel 210 may decrease. In the example of FIG. 3, in the case where a level change of the output voltage Vout1 is smaller, a coupling noise occurring in the unit pixel 110_2 may decrease.

Figure 6:
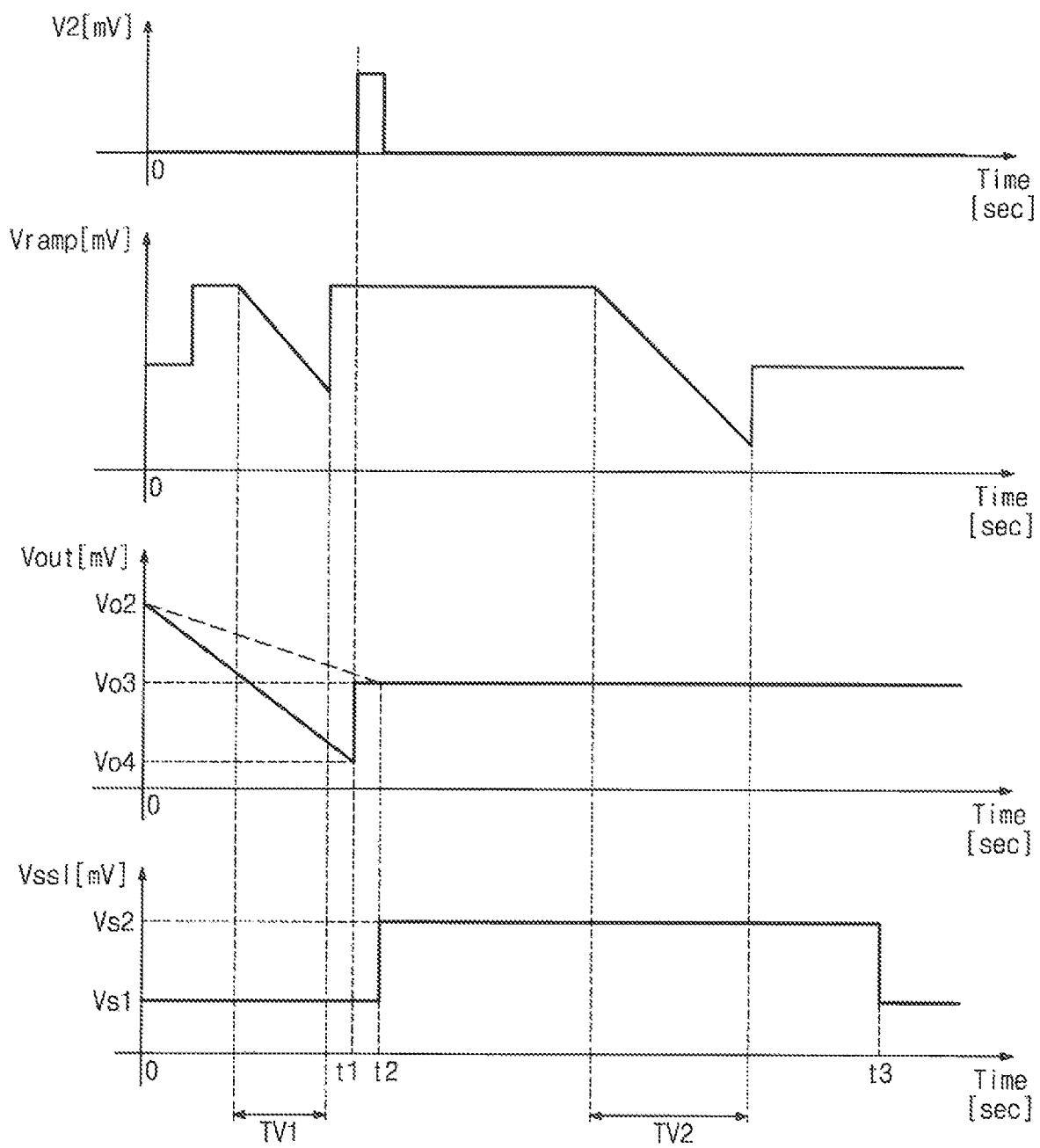
FIG. 6 is a timing diagram illustrating an example of voltages output and input by the image sensor of FIG. 4 and a ramp voltage.

FIG. 6 is a timing diagram illustrating an example of voltages output and input by an image sensor of FIG. 4 and a ramp voltage according to an embodiment of the inventive concept.

In an example of FIG. 6, the transfer transistor TG of FIG. 4 may receive the transfer voltage V2 of FIG. 6 through a gate terminal thereof. The unit pixel 210 of FIG. 4 may output the output voltage Vout of FIG. 6. The signal clamping selection transistor SCLP_SL of FIG. 4 may receive the signal clamping selection voltage Vssl of FIG. 6 through a gate terminal thereof. In an example of FIG. 6, a change in a level of the transfer voltage V2 and a level of the ramp voltage Vramp is similar to that described with reference to FIG. 2, and a description thereof is thus omitted. The first interval TV1 and the second interval TV2 are determined as in a description given with reference to FIG. 2, and a description thereof is thus omitted.

Referring to FIGS. 4 and 6, in the case where the intensity of light received by the photo diode PD is not smaller than a reference value, charges generated by the photo diode PD may overflow to the floating diffusion node FD through the transfer transistor TG being in a turn-off state. Accordingly, a level of the output voltage Vout may decrease from Vo2 to Vo4 before a time point t1 (i.e., before the transfer transistor TG of FIG. 4 is turned on).

As described with reference to FIG. 5, at the time point t1, a level of the output voltage Vout may be clamped to the specific level Vo3 corresponding to the signal clamping level voltage Vslv by the first clamp circuit 211. Accordingly, at the time point t1, a level of the output voltage Vout may increase from Vo4 to Vo3. The ADC 220 may output a code value corresponding to a level of the increased output voltage Vout. The code value corresponding to the level of the increased output voltage Vout may be smaller than a code value corresponding to a level of a decreased output voltage Vout. Accordingly, a code value calculated based on the output voltage Vout of FIG. 6 may be smaller than a code value calculated based on the output voltage Vout of FIG. 5.

As the calculated code value becomes smaller, brightness of an image corresponding to the calculated code value may become darker. As understood from a comparison of FIGS. 5 and 6, the calculated code value may decrease even though the intensity of light received by the photo diode PD increases. That is, in the case where the intensity of light received by the photo diode PD is not smaller than a reference value, an abnormal code value may be calculated. The display may output an image based on the abnormal code value (refer to FIG. 15).

Figure 7:
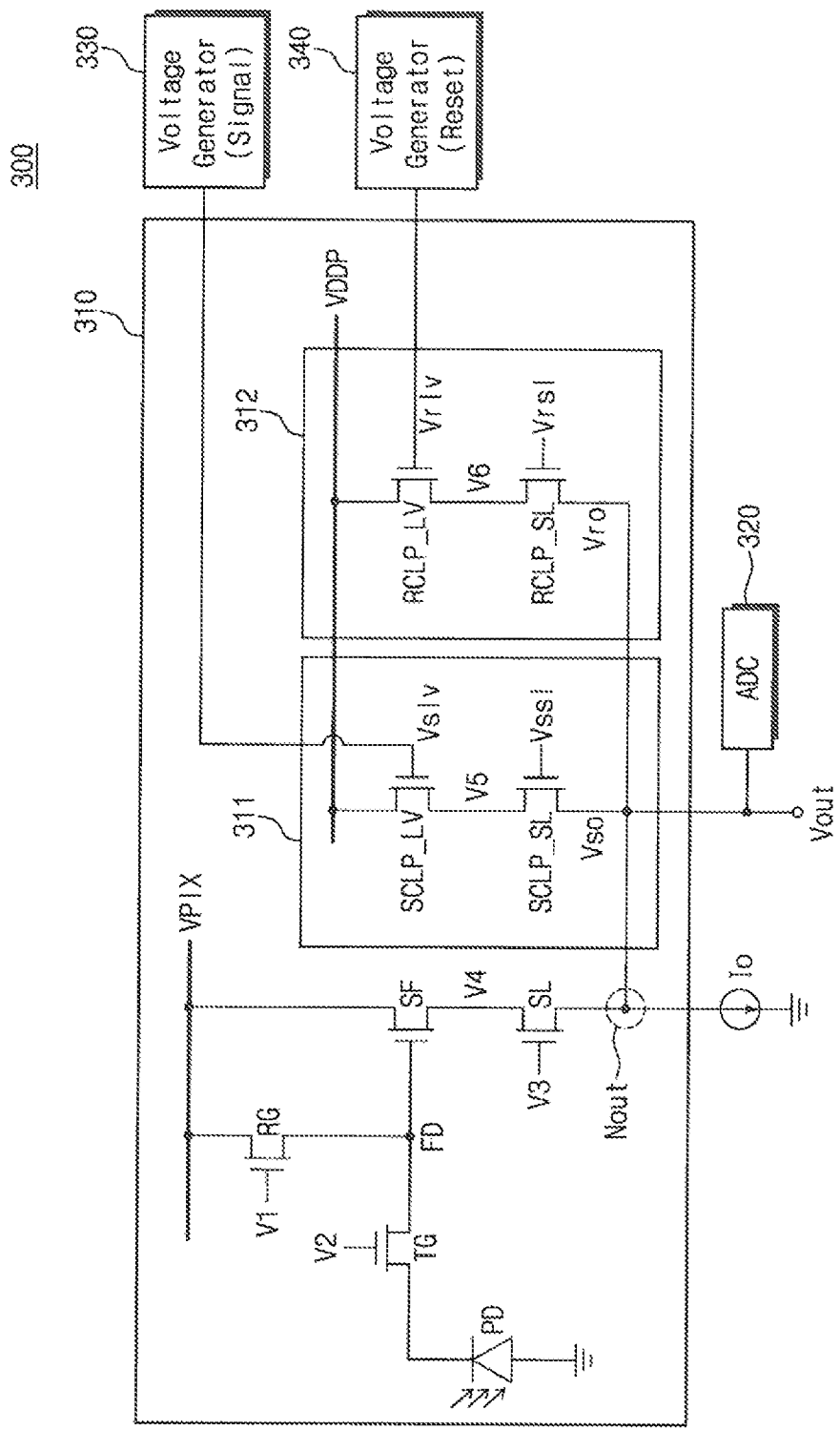
FIG. 7 is a circuit diagram illustrating an image sensor according to an embodiment of the inventive concept.

FIG. 7 is a circuit diagram illustrating an image sensor according to an embodiment of the inventive concept.

A unit pixel 310 of FIG. 7 may further include a first clamp circuit 311 and a second clamp circuit 312 compared with the unit pixel 110 of FIG. 1. The configuration and the operation of the first clamp circuit 311 are similar to the configuration and the operation of the first clamp circuit 211 of FIG. 4, and a description thereof is thus omitted.

Referring to FIG. 7, the second clamp circuit 312 may include a reset clamping level transistor RCLP_LV and a reset clamping selection transistor RCLP_SL.

The reset clamping level transistor RCLP_LV may receive a reset clamping level voltage Vrlv from a voltage generator 340 through a gate terminal thereof. A level of the reset clamping level voltage Vrlv may be set in advance in accordance with some embodiments of the inventive concept. The reset clamping level transistor RCLP_LV may receive the second bias voltage VDDP through one terminal thereof. For example, the reset clamping level transistor RCLP_LV may receive the second bias voltage VDDP from a voltage generator or the like. A level of the second bias voltage VDDP may be controlled by the voltage generator or the like. An opposite terminal of the reset clamping level transistor RCLP_LV may be connected to one terminal of the reset clamping selection transistor RCLP_SL.

The reset clamping selection transistor RCLP_SL may receive a reset clamping selection voltage Vrsl through a gate terminal thereof. For example, the reset clamping selection voltage Vrsl may be received from the voltage generator or the like. A level of the reset clamping selection voltage Vrsl may be controlled by the voltage generator or the like. The reset clamping selection transistor RCLP_SL may be turned on or turned off in response to the reset clamping selection voltage Vrsl and the output voltage Vout. An opposite terminal of the reset clamping selection transistor RCLP_SL may be connected to the output terminal Nout.

For example, the reset clamping selection transistor RCLP_SL may have a second threshold voltage. A level of the second threshold voltage may be determined based on a characteristic of the reset clamping selection transistor RCLP_SL. The reset clamping selection transistor RCLP_SL may operate based on a difference value between a level of the reset clamping selection voltage Vrsl and a level of the output voltage Vout. For example, in the case where the difference value between the level of the reset clamping selection voltage Vrsl and the level of the output voltage Vout is not smaller than a level of the second threshold voltage, the reset clamping selection transistor RCLP_SL may be turned on. In the case where the difference value between the level of the reset clamping selection voltage Vrsl and the level of the output voltage Vout is smaller than the level of the second threshold voltage, the reset clamping selection transistor RCLP_SL may be turned off.

A value obtained by subtracting a level of the second threshold voltage from a level of the output voltage Vout may be defined as a second voltage level. Accordingly, the reset clamping selection transistor RCLP_SL may operate based on whether a level of the output voltage Vout is not greater than the second voltage level. For example, in the case where a level of the output voltage Vout is not greater than the second voltage level, the reset clamping selection transistor RCLP_SL may be turned on. In the case where a level of the output voltage Vout is greater than the second voltage level, the reset clamping selection transistor RCLP_SL may be turned off.

The reset clamping level transistor RCLP_LV may output a voltage V6 corresponding to the reset clamping level voltage Vrlv. The reset clamping level voltage Vrlv may be associated with the second voltage level. Accordingly, the reset clamping level transistor RCLP_LV may output the voltage V6 associated with the second voltage level. In the case where the reset clamping selection transistor RCLP_SL is turned on, the reset clamping selection transistor RCLP_SL may output a reset clamping output voltage Vro corresponding to the voltage V6. That is, the second clamp circuit 312 may output the reset clamping output voltage Vro corresponding to the reset clamping level voltage Vrlv to the output terminal Nout. Accordingly, the reset clamping output voltage Vro may be associated with the second voltage level.

As described above, the second clamp circuit 312 may output the reset clamping output voltage Vro based on whether a level of the output voltage Vout is not greater than the second voltage level. A level of the output voltage Vout may be clamped to a specific level by the reset clamping output voltage Vro. For example, the specific level may be the second voltage level.

The configuration and the operation of the unit pixel 310 except for the second clamp circuit 312 are similar to the configuration and the operation of the unit pixel 210 of FIG. 4, and a description thereof is thus omitted.

Figure 8:
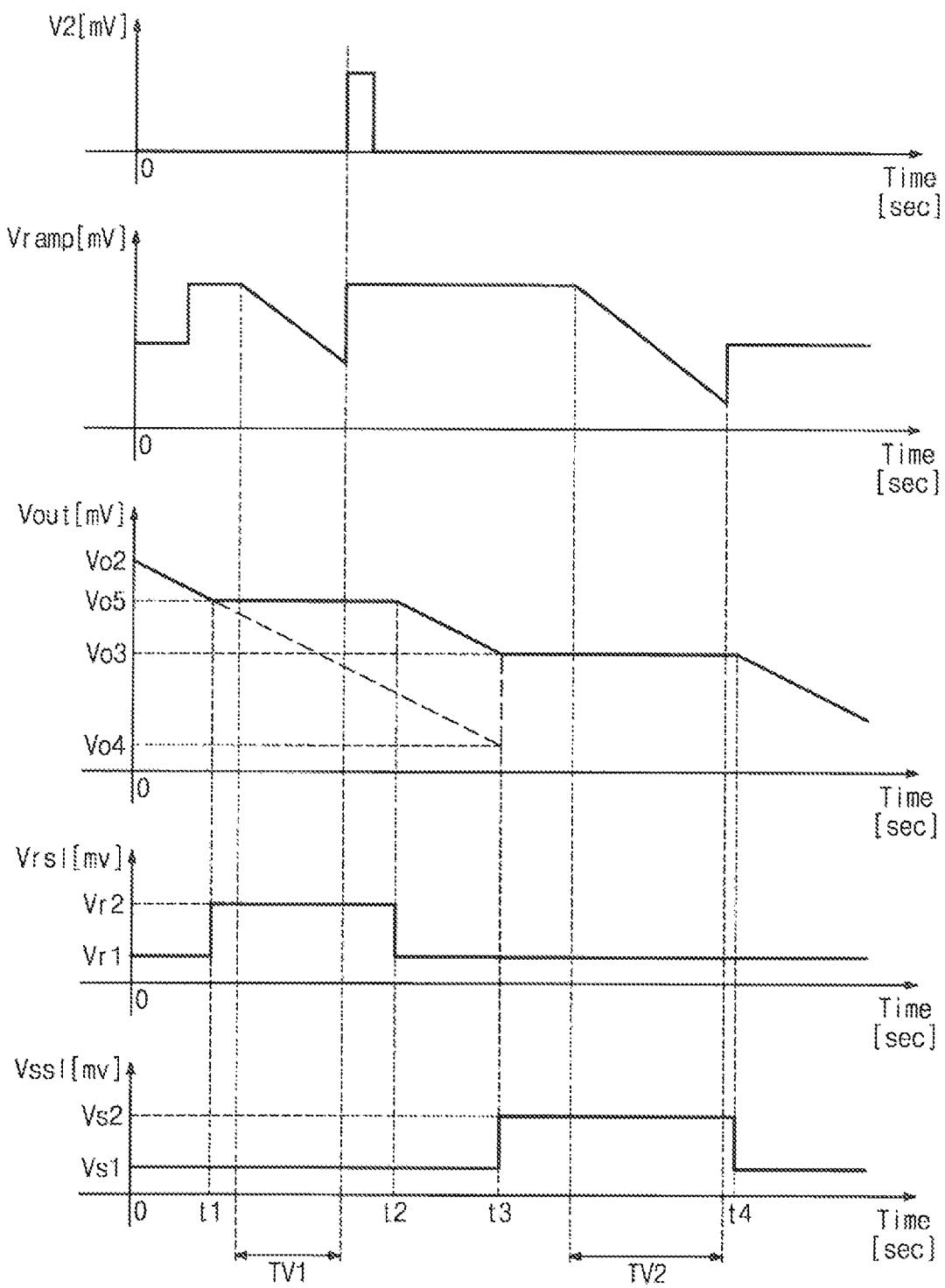
FIG. 8 is a timing diagram illustrating an example of voltages output and input by the image sensor of FIG. 7 and a ramp voltage.

FIG. 8 is a timing diagram illustrating an example of voltages output and input by an image sensor of FIG. 7 and a ramp voltage according to an embodiment of the inventive concept.

In an example of FIG. 8, the transfer transistor TG of FIG. 7 may receive the transfer voltage V2 of FIG. 8 through a gate terminal thereof. The unit pixel 310 of FIG. 7 may output the output voltage Vout of FIG. 8. The reset clamping selection transistor RCLP_SL of FIG. 7 may receive the reset clamping selection voltage Vrsl of FIG. 8 through a gate terminal thereof. The signal clamping selection transistor SCLP_SL of FIG. 7 may receive the signal clamping selection voltage Vssl of FIG. 8 through a gate terminal thereof. In an example of FIG. 8, a change in the transfer voltage V2 and the ramp voltage Vramp is similar to that described with reference to FIG. 2, and a description thereof is thus omitted. The first interval TV1 and the second interval TV2 are determined as in a description given with reference to FIG. 2, and a description thereof is thus omitted.

Between a time point "0" and a time point t1, a level of the reset clamping selection voltage Vrsl may be Vr1. At the time point t1, a level of the reset clamping selection voltage Vrsl may increase from Vr1 to Vr2 by a voltage generator or the like. A level of the reset clamping selection voltage Vrsl may be Vr2 between the time point t1 and a time point t2. Between the time point t1 and the time point t2, the reset clamping selection transistor RCLP_SL of FIG. 7 may be turned on in response to the reset clamping selection voltage Vrsl. As described with reference to FIG. 7, between the time point t1 and the time point t2, a level of the output voltage Vout may be clamped to a specific level Vo5 by the second clamp circuit 312. The specific level Vo5 may be the second voltage level of FIG. 7. Between a time point t3 and a time point t4, a level of the output voltage Vout may be clamped to the specific level Vo3 by the first clamp circuit 311. The specific level Vo3 may be the first voltage level of FIG. 4.

In the example of FIG. 8, Vo5 may be greater than Vo3. A graph represented by a dotted line may be a graph indicating a level of the output voltage Vout of FIG. 6. Accordingly, a code value calculated based on the output voltage Vout of FIG. 8 may be greater than a code value calculated based on the output voltage Vout of FIG. 6. As understood from a comparison of FIGS. 6 and 8, the code value calculated based on the output voltage Vout of FIG. 8 may be less impacted by the effects of noise.

Figure 9:
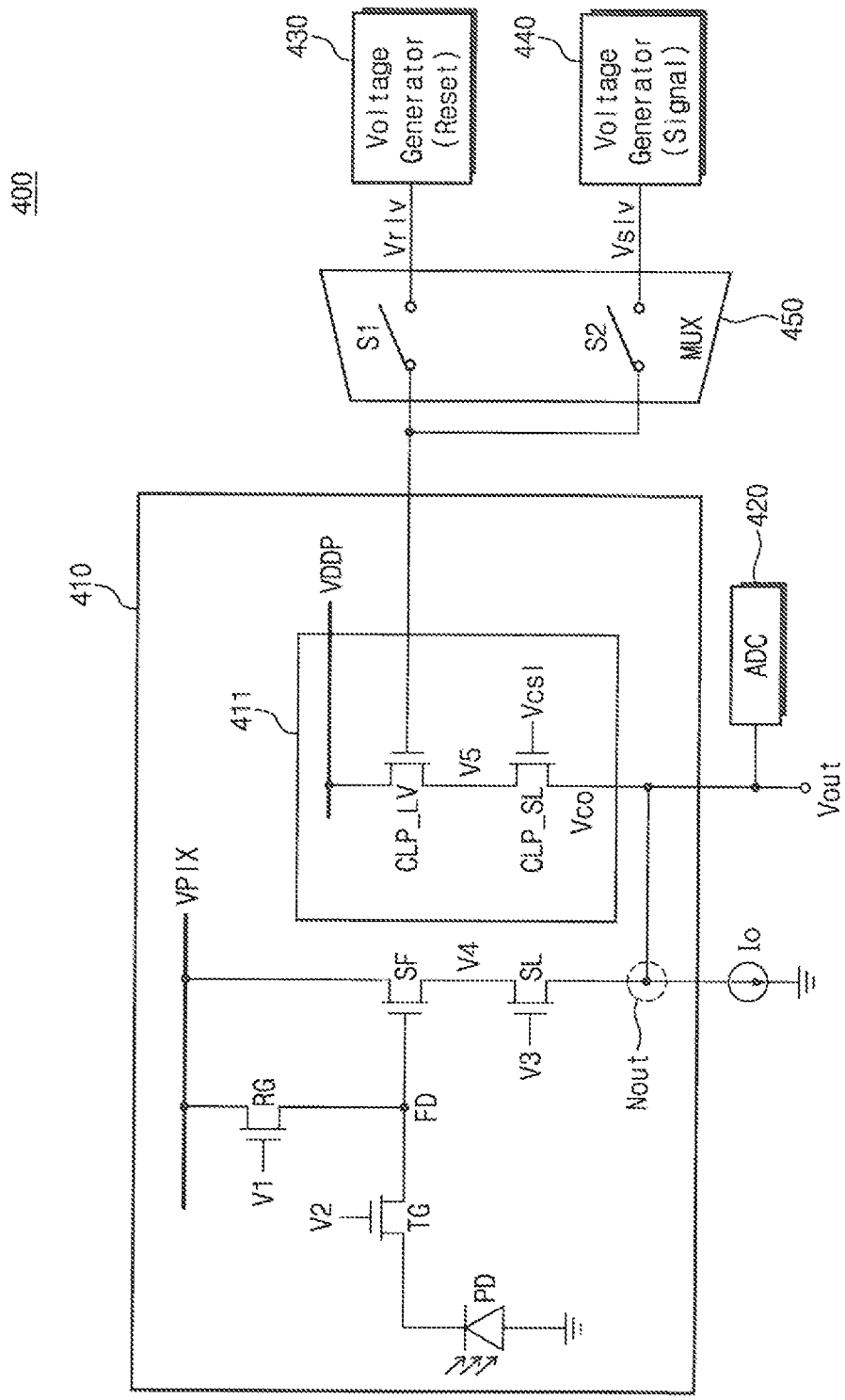
FIG. 9 is a circuit diagram illustrating an image sensor according to an embodiment of the inventive concept.

FIG. 9 is a circuit diagram illustrating an image sensor according to an embodiment of the inventive concept. An image sensor 400 of FIG. 9 may include a unit pixel 410, an ADC 420, voltage generators 430 and 440, and a multiplexer 450. The unit pixel 410 may further include a third clamp circuit 411 compared with the unit pixel 110 of FIG. 1.

Referring to FIG. 9, the third clamp circuit 411 may include a clamping level transistor CLP_LV and a clamping selection transistor CLP_SL. The multiplexer 450 may include a first switch S1 and a second switch S2. The multiplexer 450 may control a connection between a gate terminal of the clamping level transistor CLP_LV and a voltage generator 430 using the first switch S1. The multiplexer 450 may control a connection between a gate terminal of the clamping level transistor CLP_LV and a voltage generator 440 using the second switch S2.

In the case where the first switch S1 is turned on or closed, the clamping level transistor CLP_LV may receive the reset clamping level voltage Vrlv from the voltage generator 430 through a gate terminal thereof. In the case where the second switch S2 is turned on or closed, the clamping level transistor CLP_LV may receive the signal clamping level voltage Vslv from the voltage generator 440 through a gate terminal thereof. A level of the signal clamping level voltage Vslv and a level of the reset clamping level voltage Vrlv may be set in advance in accordance with some embodiments of the inventive concept. The clamping level transistor CLP_LV may receive the second bias voltage VDDP from a voltage generator or the like through one terminal thereof. A level of the second bias voltage VDDP may be controlled by the voltage generator or the like. An opposite terminal of the clamping level transistor CLP_LV may be connected to one terminal of the clamping selection transistor CLP_SL.

The clamping selection transistor CLP_SL may receive a clamping selection voltage Vcsl through a gate terminal thereof. For example, the clamping selection transistor CLP_SL may receive the clamping selection voltage Vcsl from the voltage generator or the like. A level of the clamping selection voltage Vcsl may be controlled by the voltage generator or the like. The clamping selection transistor CLP_SL may be turned on or turned off in response to the clamping selection voltage Vcsl. An opposite terminal of the clamping selection transistor CLP_SL may be connected to the output terminal Nout. An operation of the clamping selection transistor CLP_SL is similar to an operation of the signal clamping selection transistor SCLP_SL of FIG. 4, and a description thereof is thus omitted.

The clamping level transistor CLP_LV may output the voltage V5 corresponding to the signal clamping level voltage Vslv or the reset clamping level voltage Vrlv. In the case where the clamping selection transistor CLP_SL is turned on, the clamping selection transistor CLP_SL may output a clamping output voltage Vco corresponding to the voltage V5. That is, the third clamp circuit 411 may output the clamping output voltage Vco corresponding to the signal clamping level voltage Vslv or the reset clamping level voltage Vrlv to the output terminal Nout. A level of the output voltage Vout may be clamped to a specific level by the clamping output voltage Vco.

The configuration and the operation of the unit pixel 410 except for the third clamp circuit 411 are similar to the configuration and the operation of the unit pixel 110 of FIG. 1, and a description thereof is thus omitted.

Figure 10:
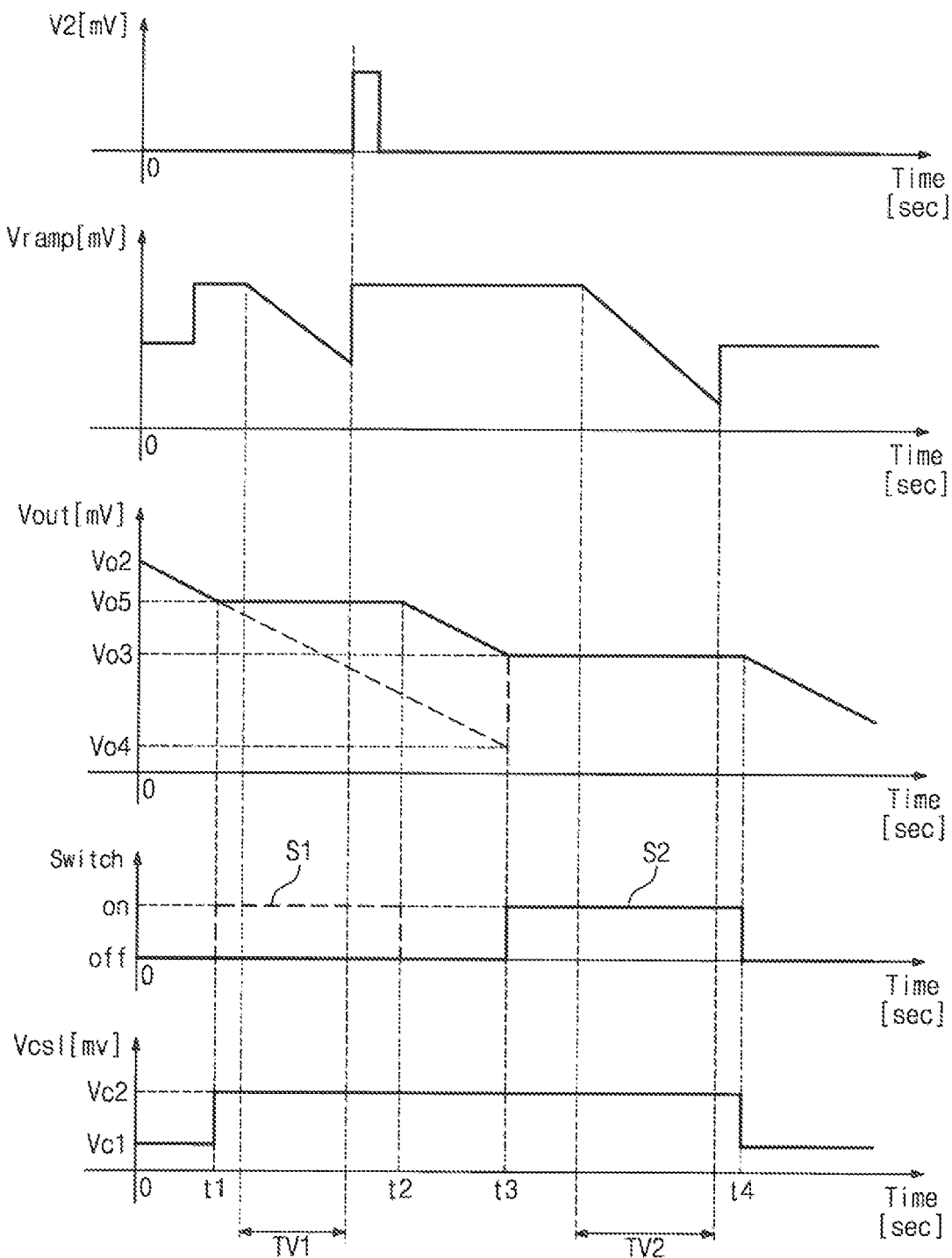
FIG. 10 is a timing diagram illustrating an example of voltages output and input by the image sensor of FIG. 9 and a ramp voltage.

FIG. 10 is a timing diagram illustrating an example of voltages output and input by an image sensor of FIG. 9 and a ramp voltage according to an embodiment of the inventive concept.

In an example of FIG. 10, the transfer transistor TG of FIG. 9 may receive the transfer voltage V2 of FIG. 10 through a gate terminal thereof. The unit pixel 410 of FIG. 9 may output the output voltage Vout of FIG. 10. The clamping selection transistor CLP_SL of FIG. 9 may receive the clamping selection voltage Vcsl of FIG. 10 through a gate terminal thereof. A connection state of the first switch S1 of FIG. 9 may be controlled by a switch signal Switch of FIG. 10. A connection state of the second switch S2 of FIG. 9 may be controlled by the switch signal Switch of FIG. 10. The multiplexer 450 may receive the switch signal Switch from an application processor or the like. The switch signal Switch may be controlled by the application processor or the like (refer to FIG. 15). In an example of FIG. 10, a change in the transfer voltage V2 and the ramp voltage Vramp is similar to that described with reference to FIG. 2, and a description thereof is thus omitted. The first interval TV1 and the second interval TV2 are determined as in a description given with reference to FIG. 2, and a description thereof is thus omitted.

Before a time point t1, a level of the clamping selection voltage Vcsl may be Vc1. At the time point t1, a voltage generator or the like may increase a level of the clamping selection voltage Vcsl from Vc1 to Vc2. A level of the clamping selection voltage Vcsl may be Vc2 between the time point t1 and a time point t4. Between the time point t1 and the time point t4, the clamping selection transistor CLP_SL may be turned on in response to the clamping selection voltage Vcsl.

The first switch S1 may be turned on or closed between the time point t1 and the time point t2. An interval between the time point t1 and the time point t2 may include the first interval TV1. The time point t1 and the time point t2 may be determined in consideration of the first interval TV1. For example, a time point before a start time point of the first interval TV1 may be determined as "t1". Also, a time point after an end time point of the first interval TV1 may be determined as "t2". Accordingly, between the time point t1 and the time point t2, the multiplexer 450 of FIG. 9 may transfer the reset clamping level voltage Vrlv to the third clamp circuit 411.

As described with reference to FIG. 9, between the time point t1 and the time point t2, the clamping level transistor CLP_LV may receive the reset clamping level voltage Vrlv from the voltage generator 430 through a gate terminal thereof. Accordingly, between the time point t1 and the time point t2, a level of the output voltage Vout may be clamped to the specific level Vo5 corresponding to the reset clamping level voltage Vrlv.

The second switch S2 may be turned on or closed between a time point t3 and a time point t4. An interval between the time point t3 and the time point t4 may include the second interval TV2. The time point t3 and the time point t4 may be determined in consideration of the second interval TV2. For example, a time point before a start time point of the second interval TV2 may be determined as "t3". Also, a time point after an end time point of the second interval TV2 may be determined as "t4". Accordingly, between the time point t3 and the time point t4, the multiplexer 450 of FIG. 9 may transfer the signal clamping level voltage Vslv to the third clamp circuit 411.

As described with reference to FIG. 9, between the time point t3 and the time point t4, the clamping level transistor CLP_LV of FIG. 9 may receive the signal clamping level voltage Vslv from the voltage generator 440 through a gate terminal thereof. Accordingly, between the time point t3 and the time point t4, a level of the output voltage Vout may be clamped to the specific level Vo3 corresponding to the signal clamping level voltage Vslv.

In the example of FIG. 10, Vo5 may be greater than Vo3. A graph represented by a dotted line may be a graph indicating a level of the output voltage Vout of FIG. 6. Accordingly, a code value calculated based on the output voltage Vout of FIG. 10 may be greater than a code value calculated based on the output voltage Vout of FIG. 6. As understood from a comparison of FIGS. 6 and 10, the code value calculated based on the output voltage Vout of FIG. 10 may be less impacted by the effects of noise.

Figure 11:
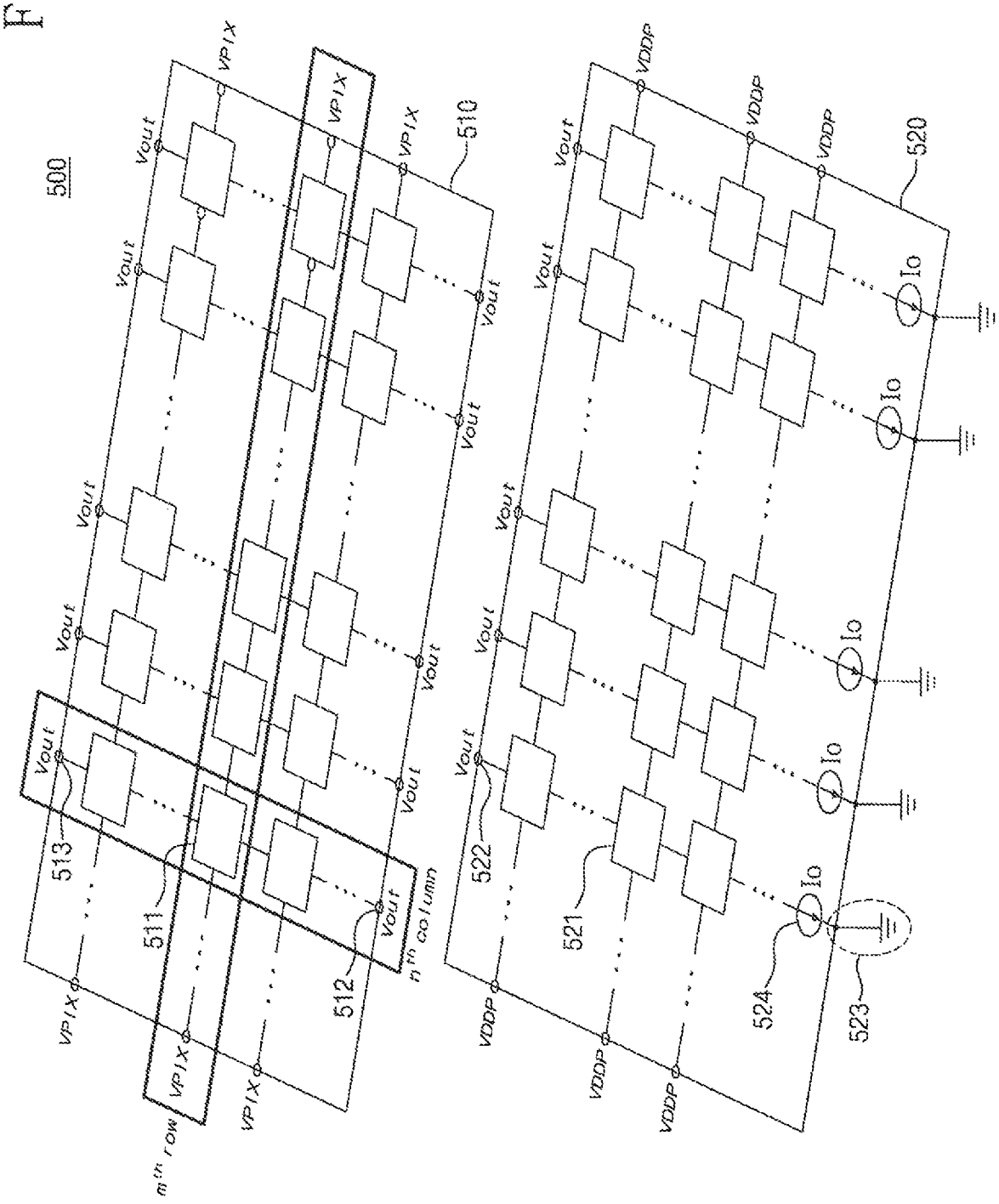
FIG. 11 is a block diagram illustrating an image sensor according to an embodiment of the inventive concept.

FIG. 11 is a block diagram illustrating an image sensor according to an embodiment of the inventive concept. An image sensor 500 of FIG. 11 may include a first substrate 510 and a second substrate 520. The first substrate 510 may include pixel units. The second substrate 520 may include clamp units and current sources Io. A specific pixel unit of the first substrate 510 and a clamp unit of the second substrate 520 corresponding to the specific pixel unit may constitute a unit pixel (refer to FIG. 12).

The current sources Io may limit levels of currents output from the pixel units and the clamp units. For example, a current source 524 may limit a level of a current output from a pixel unit 511 and a clamp unit 521. For example, a level of a current output by the current source 524 may be a first current level. A sum of a level of a current output from the pixel unit 511 and a level of a current output from the clamp unit 521 may be the first current level.

The first substrate 510 and the second substrate 520 may form a stack structure. Unit pixels included in the first substrate 510 and the second substrate 520 may form a pixel array structure. The unit pixels included in the first substrate 510 and the second substrate 520 may be the unit pixel 310 of FIG. 7 or the unit pixel 410 of FIG. 9 in accordance with various embodiments of the inventive concept.

The first substrate 510 may include the pixel unit 511. The second substrate 520 may include the clamp unit 521. The pixel unit 511 may include the unit pixel 110 of FIG. 1. The clamp unit 521 may include the first clamp circuit 211 of FIG. 4. Alternatively, the clamp unit 521 may include the first clamp circuit 311 and the second clamp circuit 312 of FIG. 7. Alternatively, the clamp unit 521 may include the third clamp circuit 411 of FIG. 9. Other pixel units included in the first substrate 510 are configured to be similar to the pixel unit 511, and a description thereof is thus omitted. Other clamp units included in the second substrate 520 are configured to be similar to the clamp unit 521, and a description thereof is thus omitted.

The pixel unit 511 may be located at a specific row and a specific column of a pixel array structure included in the first substrate 510. For example, the pixel unit 511 may be located at the m-th row and n-th column (here, "m" and "n" being natural numbers). The clamp unit 521 may be located at a specific row and a specific column of a pixel array structure included in the second substrate 520. For example, the pixel unit 521 may be located at the m-th row and n-th column.

Pixel units, which are located at the same row, from among the pixel units included in the first substrate 510 may be connected to the same line for the first bias voltage VPIX. Pixel units, which are located at the same column, from among the pixel units included in the first substrate 510 may be connected to the same line for the output voltage Vout.

Clamp units, which are located at the same row, from among the clamp units included in the second substrate 520 may be connected to the same line for the second bias voltage VDDP. Clamp units, which are located at the same column, from among the clamp units included in the second substrate 520 may be connected to the same line for the output voltage Vout.

Pixel units, which are located at the same row, from among the pixel units included in the first substrate 510 may receive the first bias voltage VPIX from the same line for the first bias voltage VPIX. The first bias voltage VPIX may be controlled by a voltage generator or the like. Pixel units, which are located at the same column, from among the pixel units included in the first substrate 510 may output the output voltage Vout to the same line for the output voltage Vout. Clamp units, which are located at the same row, from among the clamp units included in the second substrate 520 may receive the second bias voltage VDDP from the same line for the second bias voltage VDDP. The second bias voltage VDDP may be received from a voltage generator or the like. Clamp units, which are located at the same column, from among the clamp units included in the second substrate 520 may output the signal clamping output voltage Vso and the reset clamping output voltage Vro to the same line for the output voltage Vout.

Lines for the output voltage Vout of the first substrate 510 and lines for the output voltage Vout of the second substrate 520 may be connected to each other. For example, a line for the output voltage Vout for connecting an n-th column of the first substrate 510 and a line for the output voltage Vout for an n-th column of the second substrate 520 may be connected to each other. For example, an output terminal 512 included in the n-th column of the first substrate 510 may be connected to a ground terminal 523. For example, an output terminal 513 of the first substrate 510 may be connected to an output terminal 522 of the second substrate 520. Accordingly, the pixel unit 511 and the clamp unit 521 may be connected to the same output terminal.

Figure 12:
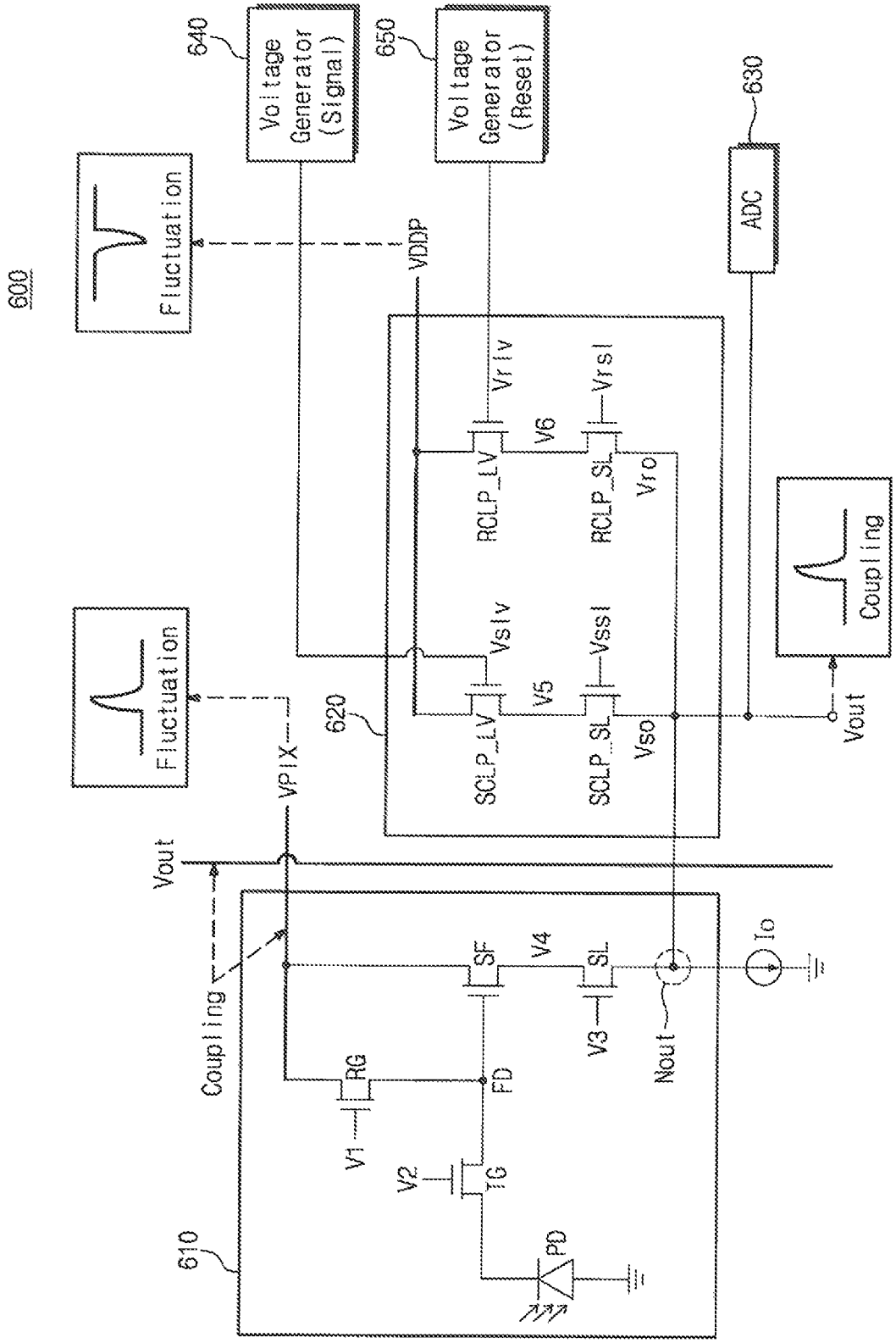
FIG. 12 is a circuit diagram illustrating an image sensor according to an embodiment of the inventive concept.

FIG. 12 is a circuit diagram illustrating an image sensor according to an embodiment of the inventive concept. An image sensor 600 of FIG. 12 may include a pixel unit 610 and a clamp unit 620. The pixel unit 610 and the clamp unit 620 may constitute a unit pixel. The pixel unit 610 of FIG. 12 may be the pixel unit 511 of FIG. 11. The clamp unit 620 of FIG. 12 may be the clamp unit 521 of FIG. 11.

A configuration and an operation of a unit pixel composed of the pixel unit 610 and the clamp unit 620 may be similar to the configuration and the operation of the unit pixel 310 of FIG. 7 or the unit pixel 410 of FIG. 9. The clamp unit 620 may include the first clamp circuit 311 and the second clamp circuit 312 of FIG. 7. Alternatively, the clamp unit 620 may include the third clamp circuit 411 of FIG. 9. Below, the image sensor 600 including the first clamp circuit 311 and the second clamp circuit 312 of FIG. 7 will be described with reference to FIG. 12.

As in the description given with reference to FIG. 7, the clamp unit 620 may output the signal clamping output voltage Vso or the reset clamping output voltage Vro to the output terminal Nout. To output the signal clamping output voltage Vso or the reset clamping output voltage Vro, the clamp unit 620 may output a current to the output terminal Nout. When a current is output to the output terminal Nout by the clamp unit 620, a level of the second bias voltage VDDP may fluctuate. That is, a level of the second bias voltage VDDP may decrease while energy of the second bias voltage VDDP is used by the clamp unit 620.

The current source Io may limit a level of a current output by the pixel unit 610 and the clamp unit 620. For example, a level of a current output from the current source Io may be a sum of a level of a current output from the pixel unit 610 and a level of a current output from the clamp unit 620. Accordingly, in the case where a current is output to the output terminal Nout by the clamp unit 620, a level of a current output by the pixel unit 610 may decrease.

A level of a current output by the buffer transistor SF and the selection transistor SL may decrease as a level of a current output by the pixel unit 610 decreases. A level of the first bias voltage VPIX may fluctuate as a level of a current output by the buffer transistor SF decreases. That is, a level of the first bias voltage VPIX may increase when the pixel unit 610 uses less energy.

The line for the first bias voltage VPIX and the line for the output voltage Vout may be located adjacent or in proximity to each other. The proximity of the line for the first bias voltage VPIX with the line for the output voltage Vout may cause coupling. Accordingly, a level of the output voltage Vout may fluctuate depending on fluctuations of a level of the first bias voltage VPIX. In an example of FIG. 12, a level of the output voltage Vout may increase as a level of the first bias voltage VPIX increases.

Figure 13:
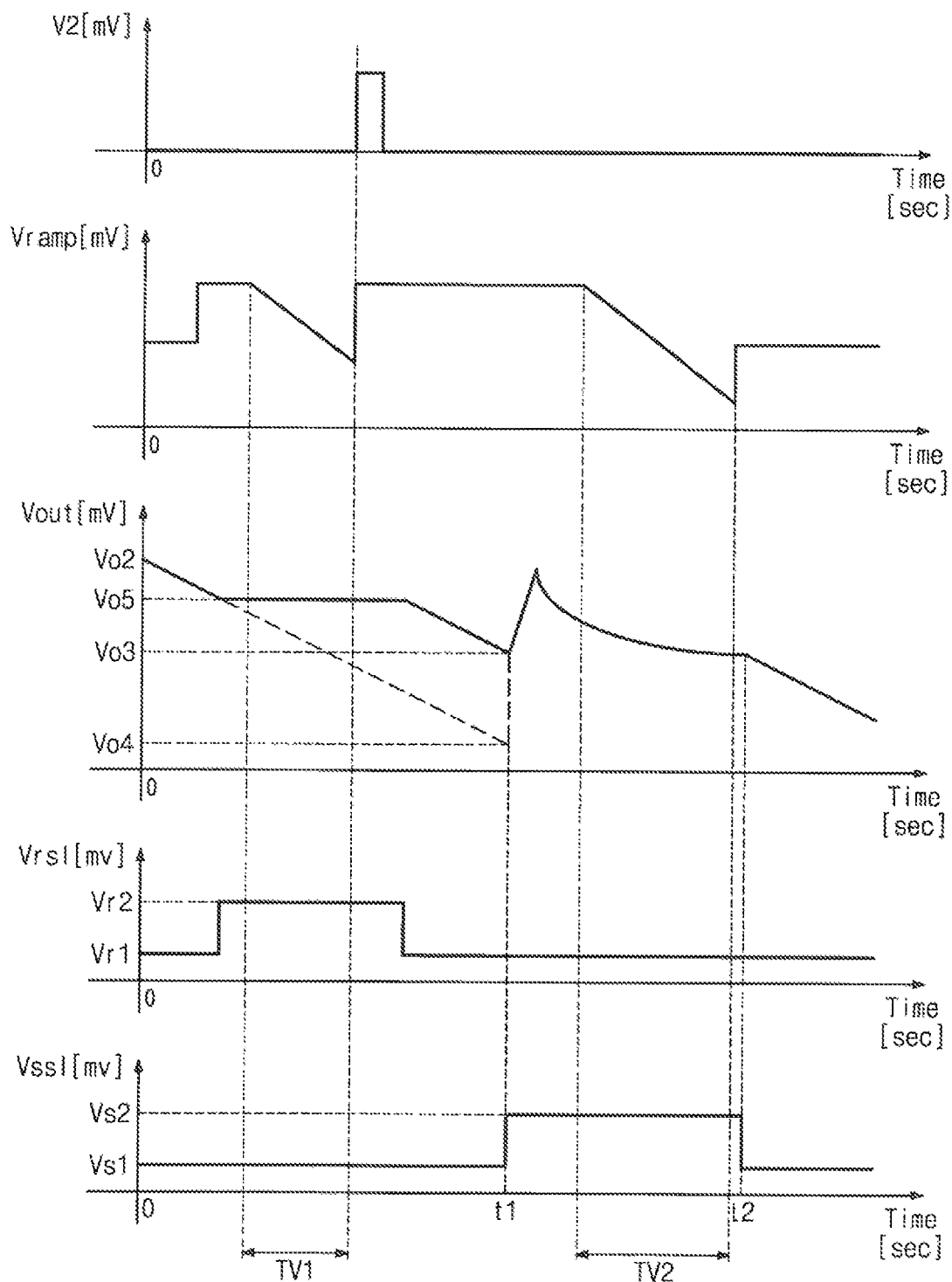
FIG. 13 is a timing diagram illustrating an example of voltages output and input by the image sensor of FIG. 12 and a ramp voltage.

FIG. 13 is a timing diagram illustrating an example of voltages output and input by an image sensor of FIG. 12 and a ramp voltage according to an embodiment of the inventive concept.

In an example of FIG. 13, the transfer transistor TG of FIG. 12 may receive the transfer voltage V2 of FIG. 13 through a gate terminal thereof. The unit pixel of FIG. 12 may output the output voltage Vout of FIG. 13. The reset clamping selection transistor RCLP_SL of FIG. 12 may receive the reset clamping selection voltage Vrsl of FIG. 13 through a gate terminal thereof. The signal clamping selection transistor SCLP_SL may receive the signal clamping selection voltage Vssl of FIG. 13 through a gate terminal thereof. In an example of FIG. 13, a change in the transfer voltage V2 and the ramp voltage Vramp is similar to that described with reference to FIG. 2, and a description thereof is thus omitted. The first interval TV1 and the second interval TV2 are determined as in a description given with reference to FIG. 2, and a description thereof is thus omitted.

Between a time point "0" and a time point t1, a level of the signal clamping selection voltage Vssl may be Vs1. At the time point t1, a voltage generator or the like may increase a level of the signal clamping selection voltage Vssl from Vs1 to Vs2. Between the time point t1 and a time point t2, a level of the signal clamping selection voltage Vssl may be Vs2. Between the time point t1 and the time point t2, the signal clamping selection transistor SCLP_SL may be turned on in response to the signal clamping selection voltage Vssl. When the signal clamping selection transistor SCLP_SL is turned on, the clamp unit 620 of FIG. 12 may output the signal clamping output voltage Vso corresponding to the signal clamping level voltage Vslv.

As described with reference to FIG. 12, as the signal clamping output voltage Vso is output by the clamp unit 620, a line for the first bias voltage VPIX, a line for the second bias voltage VDDP, and a line for the output voltage Vout may cause coupling. Due to the coupling, a level of the output voltage Vout may increase and then decrease between the time point t1 and the time point t2.

A graph of FIG. 13 represented by a dotted line may indicate the output voltage Vout of FIG. 8. As described with reference to FIGS. 8 and 10, in the second interval TV2, a level of the output voltage Vout of FIGS. 8 and 10 may be clamped to Vo3. In the second interval TV2 of FIG. 13, a level of the output voltage Vout may be greater than Vo3. Accordingly, a code value calculated based on the output voltage Vout of FIG. 13 may be smaller than a code value calculated based on the output voltage Vout of FIG. 8 or 10.

As the calculated code value becomes smaller, brightness of an image output by a display device based on the calculated code value may become darker. As understood from a comparison of FIG. 13 and FIG. 8 or 10, even though the intensity of light received by the photo diode PD of FIGS. 7 and 9 and the intensity of light received by the photo diode PD of FIG. 12 are the same, a code value calculated based on the output voltage Vout may decrease. That is, an abnormal code value may be calculated based on the output voltage Vout of FIG. 13. The display may output an image including SHBN based on the abnormal code value (refer to FIG. 15).

Figure 14:
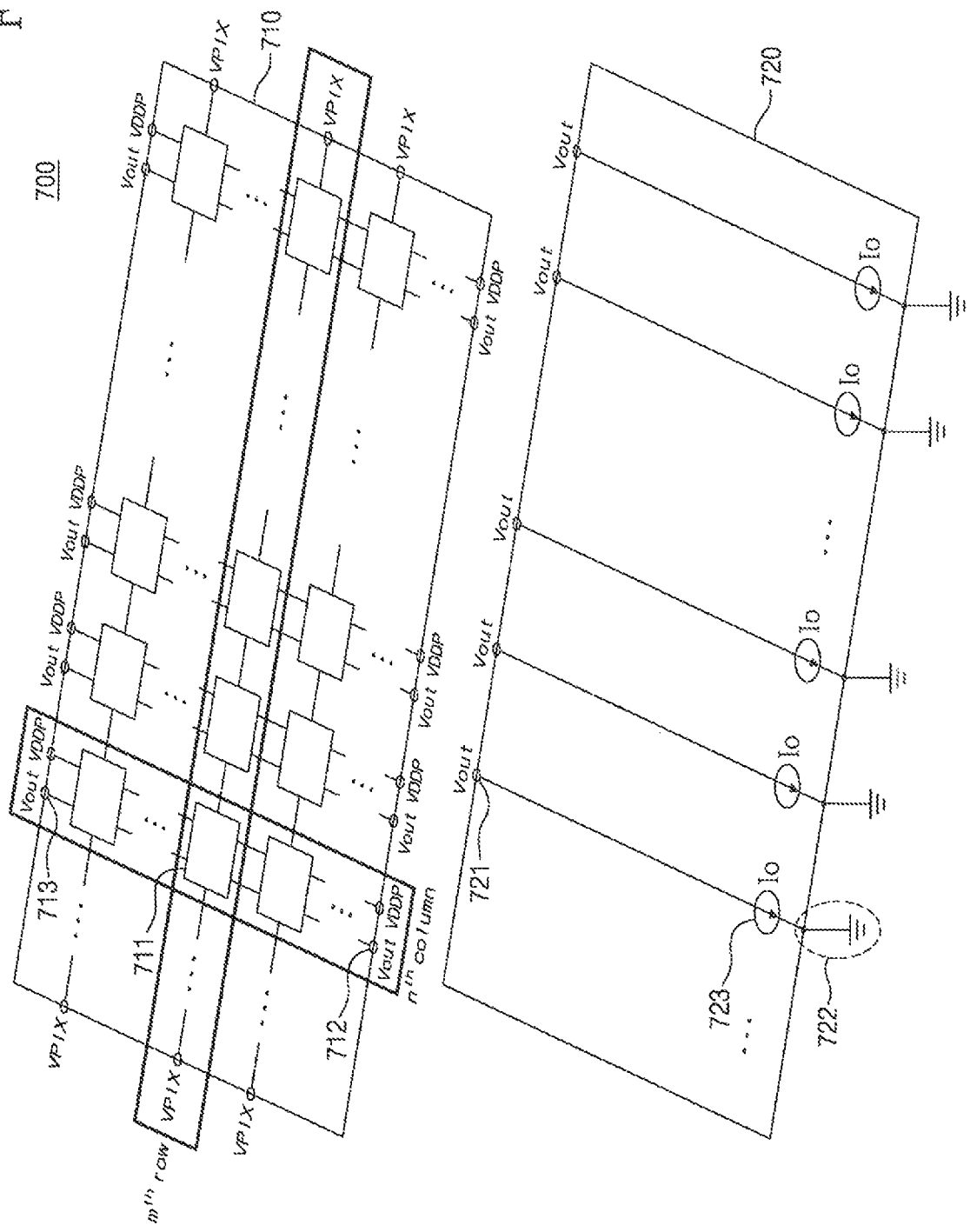
FIG. 14 is a block diagram illustrating an image sensor according to an embodiment of the inventive concept.

FIG. 14 is a block diagram illustrating an image sensor according to an embodiment of the inventive concept. An image sensor 700 of FIG. 11 may include a first substrate 710 and a second substrate 720. Referring to FIG. 14, the first substrate 710 and the second substrate 720 may form a stack structure.

Referring to FIG. 14, the first substrate 710 may include one or more unit pixels. Unit pixels included in the first substrate 710 may form a pixel array structure. The second substrate 720 may include current sources Io.

For example, the first substrate 710 may include a unit pixel 711. The unit pixel 711 may include at least one of the unit pixel 210 of FIG. 3, the unit pixel 310 of FIG. 7 and the unit pixel 410 of FIG. 9, and the pixel unit 610 and the clamp unit 620 of FIG. 12. The unit pixel 711 may be located at a specific row and a specific column of a pixel array included in the first substrate 710. For example, the unit pixel 711 may be located at the m-th row and n-th column (here, "m" and "n" being a natural number).

The current sources Io may limit levels of currents output from the unit pixels. For example, a current source 723 may limit a level of a current output from the unit pixel 711. In the case where a level of a current output by the current source 723 is a second current level, a level of a current output from the pixel unit 711 may be the second current level.

Unit pixels, which are located at the same row, from among the unit pixels included in the first substrate 710 may be connected to a line for the first bias voltage VPIX. Unit pixels, which are located at the same column, from among the unit pixels included in the first substrate 710 may be connected to the same line for the output voltage Vout and the same line for the second bias voltage VDDP. The current sources Io included in the second substrate 720 may be respectively connected to lines for the output voltage Vout.

Unit pixels, which are located at the same row, from among the unit pixels included in the first substrate 710 may receive the first bias voltage VPIX from the same line for the first bias voltage VPIX. Unit pixels, which are located at the same column, from among the unit pixels included in the first substrate 710 may receive the second bias voltage VDDP from the same line for the second bias voltage VDDP. Unit pixels, which are located at the same column, from among the unit pixels included in the first substrate 710 may output the output voltage Vout to the same line for the output voltage Vout.

Lines for the output voltage Vout of the first substrate 710 and lines for the output voltage Vout of the second substrate 720 may be connected to each other. For example, a line for the output voltage Vout for connecting an n-th column of the first substrate 710 and a line for the output voltage Vout for an n-th column of the second substrate 720 may be connected to each other. An output terminal 712 of the first substrate 710 may be connected to a ground terminal 722. An output terminal 713 of the first substrate 710 may be connected to an output terminal 721 of the second substrate 720.

For example, a line for the first bias voltage VPIX at the m-th row and a line for the second bias voltage VDDP at the n-th column may be adjacent to each other. In the first substrate 710, lines for the first bias voltage VPIX and lines for the second bias voltage VDDP may be disposed in a mesh shape. Accordingly, the first bias voltage VPIX and the second bias voltage VDDP may have an influence on each other.

Referring to FIGS. 12 and 14, a line for the first bias voltage VPIX at the m-th row, a line for the second bias voltage VDDP at the n-th column, and a line for the output voltage Vout at the n-th column may cause the coupling. As described with reference to FIG. 12, in the case where a level of the first bias voltage VPIX supplied to an m-th row increases, a level of the second bias voltage VDDP supplied to an n-th column decreases. Referring to FIG. 14, because a line for the first bias voltage VPIX at the m-th row and a line for the second bias voltage VDDP at the n-th column are adjacent or in proximity to each other, fluctuations of the first bias voltage VPIX may be offset by fluctuations of the second bias voltage VDDP.

Lines for the first bias voltage VPIX and lines for the second bias voltage VDDP of FIG. 14 may be placed closer to each other than lines for the first bias voltage VPIX and lines for the second bias voltage VDDP of FIG. 11. Accordingly, stability of the first bias voltage VPIX and the second bias voltage VDDP supplied in the stack structure of FIG. 14 may be higher than stability of the first bias voltage VPIX and the second bias voltage VDDP supplied in the stack structure of FIG. 11. This may mean that the unit pixels of FIG. 14 are supplied with the first bias voltage VPIX and the second bias voltage VDDP more stably than the unit pixels of FIG. 11.

A change in levels of the first bias voltage VPIX and the second bias voltage VDDP of FIG. 14 may be smaller than a change in levels of the first bias voltage VPIX and the second bias voltage VDDP of FIG. 11. Accordingly, a code value calculated based on the output voltage Vout of FIG. 14 may be less impacted by the effects of noise.

A change in the output voltage Vout of FIG. 14 is similar to a change in the output voltage Vout of FIG. 8 or 10, and a description thereof is thus omitted.

Figure 15:
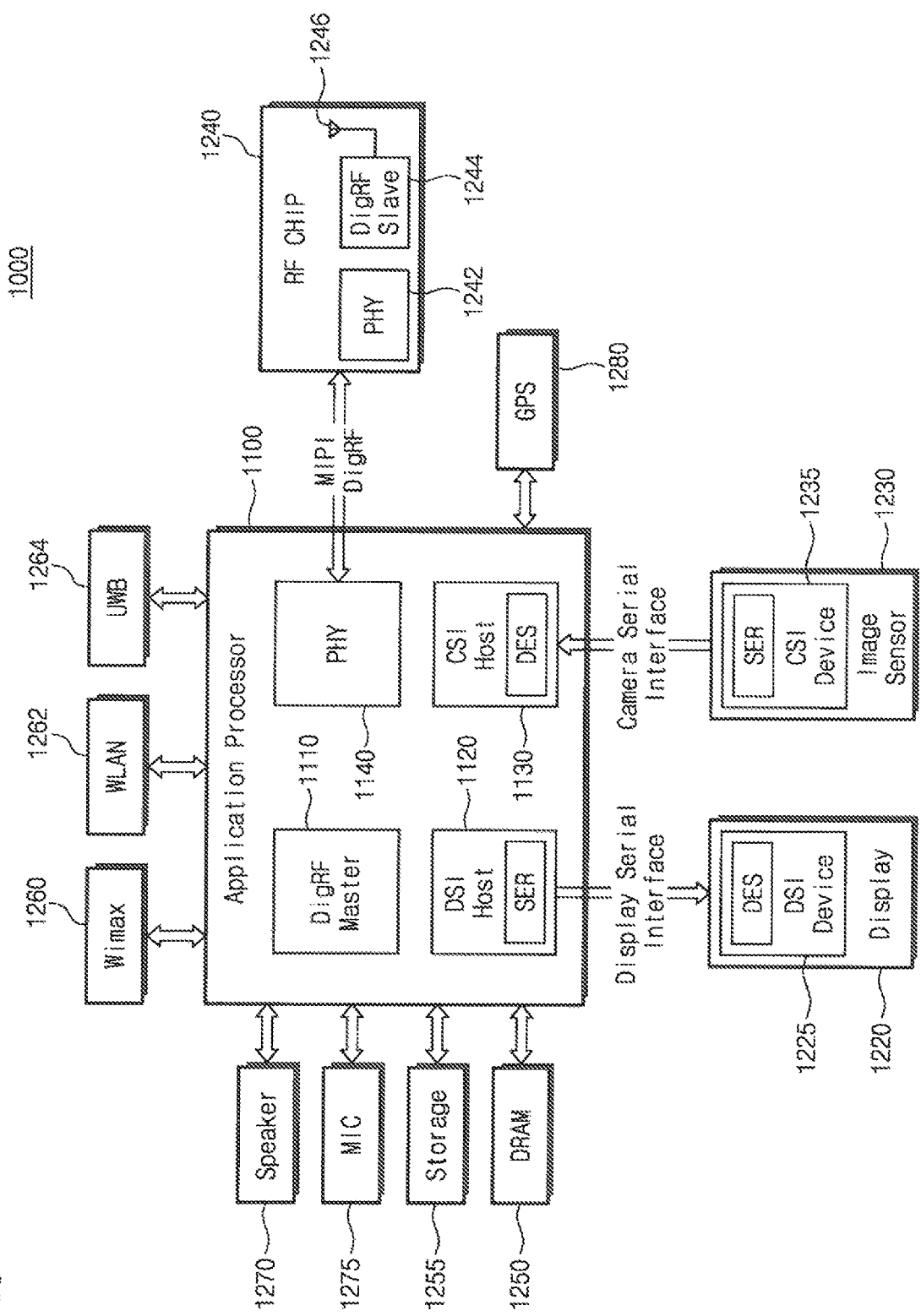
FIG. 15 is a block diagram illustrating an electronic device including the image sensor of FIG. 14 according to an embodiment of the inventive concept.

FIG. 15 is a block diagram illustrating an electronic device including an image sensor of FIG. 14 according to an embodiment of the inventive concept.

An electronic device 1000 may be implemented with a data processing device that is able to use or support an interface protocol proposed by the Mobile Industry Processor Interface (MIPI) alliance. For example, the electronic device 1000 may be one of several types of electronic devices, such as, but not limited to, a portable communication terminal, a personal digital assistant (PDA), a portable media player (PMP), a smartphone, a tablet computer, and a wearable device.

The electronic device 1000 may comprise an application processor 1100, a display 1220, and an image sensor 1230. The application processor 1100 may comprise a DigRF master 1110, a display serial interface (DSI) host 1120, a camera serial interface (CSI) host 1130, and a physical layer 114). The application processor 1100 may control overall operations of the image sensor 200 of FIG. 4, the image sensor 300 of FIG. 7, the image sensor 400 of FIG. 9, the image sensor 500 of FIG. 11, the image sensor 600 of FIG. 12, and the image sensor 700 of FIG. 14. For example, the application processor 1100 may control the switch signal Switch of FIG. 10.

The DSI host 1120 may communicate with a DSI device 1225 of the display 1220 through the DSI. For example, a serializer SER may be implemented in the DSI host 1120. For example, a deserializer DES may be implemented in the DSI device 1225.

The CSI host 1130 may communicate with a CSI device 1235 of the image sensor 1230 through the CSI. For example, a deserializer DES may be implemented in the CSI host 1130, and a serializer SER may be implemented in the CSI device 1235.

The image sensor 1230 may comprise at least one of the image sensor 200 of FIG. 4, the image sensor 300 of FIG. 7, the image sensor 400 of FIG. 9, the image sensor 500 of FIG. 11, the image sensor 600 of FIG. 12, and the image sensor 700 of FIG. 14. The image sensor 1230 may output a code value based on the output voltage Vout illustrated in FIGS. 5, 8, and 10. The image sensor 1230 may output the calculated code value through the CSI. The code value may be associated with the intensity of light received by the image sensor 1230.

The display 1220 may include the DSI device 1225. The display 1220 may output an image based on the code value output from the image sensor 1230. Accordingly, the display 1220 may output an image that is not affected by SHBN or in which the effects of SHBN are reduced.

The electronic device 1000 may further comprise a radio frequency (RF) chip 1240 that communicates with the application processor 1100. The RF chip 1240 may comprise a physical layer 1242, a DigRF slave 1244, and an antenna 1246. For example, the physical layer 1242 of the RF chip 1240 and the physical layer 1140 of the application processor 1100 may exchange data with each other through DigRF interface proposed by the MIPI alliance.

The electronic device 1000 may further comprise a dynamic random access memory (DRAM) 1250 and storage 1255. The DRAM 1250 and the storage 1255 may store data received from the application processor 1100. Also, the DRAM 1250 and the storage 1255 may provide the stored data to the application processor 1100. The DRAM 1250 and the storage 1255 may store information associated with signals received from the image sensor 200 of FIG. 4, the image sensor 300 of FIG. 7, the image sensor 400 of FIG. 9, the image sensor 500 of FIG. 11, the image sensor 600 of FIG. 12, and the image sensor 700 of FIG. 14.

The electronic device 1000 may communicate with an external device/system through communication modules, such as a worldwide interoperability for microwave access (WiMAX) 1260, a wireless local area network (WLAN) 1262, and an ultra-wideband (UWB) 1264. The electronic device 1000 may further comprise a speaker 1270 and a microphone 1275, which are used to process voice information. The electronic device 1000 may further comprise a global positioning system (GPS) device 1280 for processing position information.

According to an embodiment of the inventive concept, an image of an improved image quality may be provided.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An electronic circuit comprising:
   a unit pixel configured to output a voltage having an output voltage level, the output voltage level being a first output voltage level in a first time interval and being a second output voltage level in a second time interval different from the first time interval;
   a first voltage generator configured to generate a reset clamping level voltage;
   a second voltage generator configured to generate a signal clamping level voltage;
   a first clamp circuit configured to receive the reset clamping level voltage and clamp the output voltage level from the unit pixel to a first voltage level corresponding to the reset clamping level voltage responsive to the first output voltage level being not greater than the first voltage level in the first time interval; and
   a second clamp circuit configured to receive the signal clamping level voltage and clamp the output voltage level from the unit pixel to a second voltage level corresponding to the signal clamping level voltage responsive to the second output voltage level being not greater than the second voltage level in the second time interval.

2. The electronic circuit of claim 1, wherein the first clamp circuit, the second clamp circuit, and the unit pixel are on a same substrate.

3. The electronic circuit of claim 1, wherein the first time interval precedes the second time interval, and
   wherein the first voltage level is greater than the second voltage level.

4. The electronic circuit of claim 1, further comprising:
   an analog to digital converter (ADC) configured to receive the voltage output from the unit pixel,
   wherein a code value corresponding to the voltage output from the unit pixel is output from the ADC, and wherein the code value corresponds to an intensity of light received in the unit pixel.

5. The electronic circuit of claim 1, wherein the unit pixel comprises:
- a photo diode configured to output charges in response to light;
- a first transistor configured to adjust a level of the voltage output from the unit pixel to a reference voltage before the first time interval;
- a second transistor configured to transfer the charges output from the photo diode to a floating diffusion node;
- a third transistor configured to output a voltage corresponding to a voltage of the floating diffusion node; and
- a fourth transistor configured to output a voltage corresponding to the voltage output from the third transistor in response to a first selection voltage,
- wherein the voltage output from the fourth transistor is the voltage output from the unit pixel.

6. The electronic circuit of claim 5, wherein the first transistor is configured to receive a first bias voltage from at least one voltage generator, and the third transistor is configured to receive a second bias voltage from at least one voltage generator.

7. The electronic circuit of claim 5, wherein the first clamp circuit comprises:
- a first level transistor configured to output a voltage associated with the first voltage level; and
- a first selection transistor configured to output a voltage corresponding to the voltage output from the first level transistor in response to a second selection voltage and the voltage output from the unit pixel.

8. The electronic circuit of claim 7, wherein the second clamp circuit comprises:
- a second level transistor configured to output a voltage associated with the second voltage level, the second voltage level being less than the first voltage level; and
- a second selection transistor configured to output a voltage corresponding to the voltage output from the second level transistor in response to a third selection voltage and the voltage output from the unit pixel.

9. An image sensor comprising:
- a first substrate comprising a unit pixel configured to output a voltage having an output voltage level corresponding to an intensity of received light; and
- a second substrate comprising a current source configured to limit a level of a current output from the unit pixel,
- wherein the unit pixel comprises:
  - a first clamp circuit configured to clamp the output voltage level from the unit pixel to a first voltage level in a first time interval responsive to the output voltage level from the unit pixel being not greater than the first voltage level in the first time interval; and
  - a second clamp circuit configured to clamp the output voltage level from the unit pixel to a second voltage level in a second time interval different from the first time interval responsive to the output voltage level from the unit pixel being not greater than the second voltage level in the second time interval,
- wherein the first substrate comprises the first and second clamp circuits, and
- wherein the first substrate is stacked on the second substrate.

10. The image sensor of claim 9, wherein the level of the current output from the unit pixel is a level of a current output from the current source.

11. The image sensor of claim 9, wherein the unit pixel is configured to receive a first bias voltage through a first bias voltage line of the first substrate.

12. The image sensor of claim 11, wherein the first clamp circuit and the second clamp circuit are configured to receive a second bias voltage through a second bias voltage line of the first substrate.

13. The image sensor of claim 12, wherein the first bias voltage line and the second bias voltage line are on the first substrate in a mesh shape.

14. The image sensor of claim 12, wherein the output voltage level from the unit pixel is maintained substantially constant responsive to variations in at least one of a level of the first bias voltage and a level of the second bias voltage.

15. The image sensor of claim 9, wherein the first time interval includes a time interval in which a ramp voltage varies at a constant ratio over time, and
- wherein the image sensor further comprises an analog to digital converter (ADC) that is configured to output a code value based on variation of the ramp voltage in the first time interval.

16. The image sensor of claim 15, wherein the second time interval, which follows the first time interval, includes a time interval in which the ramp voltage varies at a constant ratio over time, and
- wherein the ADC is configured to output the code value based on variation of the ramp voltage in the second time interval.

17. An image sensor comprising:
- a pixel unit configured to output a voltage having an output voltage level based on an intensity of received light; and
- a clamp unit configured to:
- output a first clamping voltage for clamping a the output voltage level from the pixel unit to a first voltage level in response to a first selection voltage and responsive to the output voltage level from the pixel unit being not greater than the first voltage level in a first time interval, and
- output a second clamping voltage for clamping the output voltage level from the pixel unit to a second voltage level in response to a second selection voltage and responsive to the output voltage level from the pixel unit being not greater than the second voltage level in a second time interval different from the first time interval; and
- a multiplexer configured to selectively transfer one of a voltage associated with the first clamping voltage and a voltage associated with the second clamping voltage to the clamp unit.

18. The image sensor of claim 17, wherein the pixel unit and the clamp unit operate responsive to a first bias voltage and a second bias voltage received on the same substrate.

19. The image sensor of claim 17, further comprising:
- a current source configured to limit a level of a current output from the pixel unit and the clamp unit,
- wherein the current source is on a substrate different from a substrate comprising the pixel unit and the clamp unit.

20. The image sensor of claim 17, wherein the multiplexer is configured to:
- transfer the voltage associated with the first clamping voltage to the clamp unit during a time interval including the first time interval; and
- transfer the voltage associated with the second clamping voltage to the clamp unit during a time interval including the second time interval.

* * * * *